US009343448B2

(12) United States Patent
Sakariya et al.

(10) Patent No.: US 9,343,448 B2
(45) Date of Patent: May 17, 2016

(54) ACTIVE MATRIX EMISSIVE MICRO LED DISPLAY

(71) Applicant: LuxVue Technology Corporation, Santa Clara, CA (US)

(72) Inventors: Kapil V. Sakariya, Los Altos, CA (US); Andreas Bibl, Los Altos, CA (US); Hsin-Hua Hu, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 0 days.

(21) Appl. No.: 14/860,185

(22) Filed: Sep. 21, 2015

(65) Prior Publication Data

US 2016/0013170 A1 Jan. 14, 2016

Related U.S. Application Data

(63) Continuation of application No. 13/842,721, filed on Mar. 15, 2013, now Pat. No. 9,159,700, and a continuation-in-part of application No. 13/710,443, filed on Dec. 10, 2012, now Pat. No. 9,178,123.

(51) Int. Cl.
H01L 25/16 (2006.01)
H01L 33/06 (2010.01)
H01L 33/38 (2010.01)
H01L 33/54 (2010.01)
H01L 33/62 (2010.01)
H01L 33/42 (2010.01)

(52) U.S. Cl.
CPC ............. H01L 25/167 (2013.01); H01L 33/06 (2013.01); H01L 33/38 (2013.01); H01L 33/42 (2013.01); H01L 33/54 (2013.01); H01L 33/62 (2013.01)

(58) Field of Classification Search
CPC ....................................................... H01L 24/29
See application file for complete search history.

(56) References Cited

U.S. PATENT DOCUMENTS 5,592,358 A 1/1997 Shamouilian et al.
5,839,187 A 11/1998 Sato et al.
(Continued)

FOREIGN PATENT DOCUMENTS

JP 08-045972 A 2/1996
JP 3406207 5/1999
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

Primary Examiner — Jerome Jackson, Jr.
Assistant Examiner — Ankush Singal
(74) Attorney, Agent, or Firm — Blakely, Sokoloff, Taylor & Zafman LLP

(57) ABSTRACT

A display panel and a method of forming a display panel are described. The display panel may include a thin film transistor substrate including a pixel area and a non-pixel area. The pixel area includes an array of bank openings and an array of bottom electrodes within the array of bank openings. An array of micro LED devices are bonded to the corresponding array of bottom electrodes within the array of bank openings. An array of top electrode layers are formed electrically connecting the array of micro LED devices to a ground line in the non-pixel area.

20 Claims, 17 Drawing Sheets

(56) References Cited

U.S. PATENT DOCUMENTS

| | | | |
|---|---|---|---|
| 5,851,664 A | 12/1998 | Bennett et al. | |
| 5,888,847 A | 3/1999 | Rostoker et al. | |
| 5,903,428 A | 5/1999 | Grimard et al. | |
| 5,996,218 A | 12/1999 | Shamouilian et al. | |
| 6,071,795 A | 6/2000 | Cheung et al. | |
| 6,335,263 B1 | 1/2002 | Cheung et al. | |
| 6,403,985 B1 | 6/2002 | Fan et al. | |
| 6,420,242 B1 | 7/2002 | Cheung et al. | |
| 6,521,511 B1 | 2/2003 | Inoue et al. | |
| 6,531,996 B1 | 3/2003 | Murade | |
| 6,558,109 B2 | 5/2003 | Gibbel | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,786,390 B2 | 9/2004 | Yang et al. | |
| 6,878,607 B2 | 4/2005 | Inoue et al. | |
| 6,911,666 B2 | 6/2005 | Voutsas | |
| 7,033,842 B2 | 4/2006 | Haji et al. | |
| 7,148,127 B2 | 12/2006 | Oohata et al. | |
| 7,160,633 B2 | 1/2007 | Tai et al. | |
| 7,161,184 B2 | 1/2007 | Miyagi et al. | |
| 7,208,337 B2 | 4/2007 | Eisert et al. | |
| 7,224,118 B2 | 5/2007 | Yamazaki et al. | |
| 7,353,596 B2 | 4/2008 | Shida et al. | |
| 7,358,158 B2 | 4/2008 | Aihara et al. | |
| 7,482,696 B2 | 1/2009 | Shei et al. | |
| 7,495,389 B2 | 2/2009 | Noguchi et al. | |
| 7,510,889 B2 | 3/2009 | Pan et al. | |
| 7,585,703 B2 | 9/2009 | Matsumura et al. | |
| 7,723,764 B2 | 5/2010 | Oohata et al. | |
| 7,791,267 B2 | 9/2010 | Baek et al. | |
| 7,795,629 B2 | 9/2010 | Watanabe et al. | |
| 7,795,804 B2 | 9/2010 | Kim | |
| 7,797,820 B2 | 9/2010 | Shida et al. | |
| 7,838,410 B2 | 11/2010 | Hirao et al. | |
| 7,872,418 B2 | 1/2011 | Hata et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,972,875 B2 | 7/2011 | Rogers et al. | |
| 7,994,711 B2 | 8/2011 | Nakamura et al. | |
| 7,999,454 B2 | 8/2011 | Winters et al. | |
| 8,023,248 B2 | 9/2011 | Yonekura et al. | |
| 8,049,410 B2 | 11/2011 | Suh et al. | |
| 8,497,143 B2 | 7/2013 | Han | |
| 8,497,512 B2 | 7/2013 | Nakamura et al. | |
| 8,833,982 B2 | 9/2014 | Funakubo | |
| 8,912,020 B2 | 12/2014 | Bedell et al. | |
| 8,921,869 B2 | 12/2014 | Welch et al. | |
| 2001/0029088 A1 | 10/2001 | Odajima et al. | |
| 2002/0076848 A1 | 6/2002 | Spooner et al. | |
| 2002/0158835 A1* | 10/2002 | Kobayashi | H01L 27/3244 345/100 |
| 2003/0017360 A1 | 1/2003 | Tai et al. | |
| 2003/0094615 A1 | 5/2003 | Yamazaki et al. | |
| 2003/0177633 A1 | 9/2003 | Haji et al. | |
| 2004/0208210 A1 | 10/2004 | Inoguchi | |
| 2004/0217704 A1 | 11/2004 | Iwase et al. | |
| 2004/0256620 A1 | 12/2004 | Yamazaki et al. | |
| 2005/0051776 A1 | 3/2005 | Miyagi et al. | |
| 2005/0104530 A1 | 5/2005 | Chung et al. | |
| 2005/0116620 A1 | 6/2005 | Kobayashi | |
| 2005/0167682 A1 | 8/2005 | Fukasawa | |
| 2005/0218468 A1 | 10/2005 | Owen et al. | |
| 2005/0274959 A1 | 12/2005 | Kim et al. | |
| 2005/0285830 A1 | 12/2005 | Iwabuchi | |
| 2006/0071225 A1 | 4/2006 | Beeson et al. | |
| 2006/0169993 A1 | 8/2006 | Fan et al. | |
| 2006/0202210 A1 | 9/2006 | Mok et al. | |
| 2006/0208271 A1 | 9/2006 | Kim et al. | |
| 2006/0238463 A1 | 10/2006 | Kim et al. | |
| 2007/0166851 A1 | 7/2007 | Tran et al. | |
| 2008/0093606 A1 | 4/2008 | Pan et al. | |
| 2008/0163481 A1 | 7/2008 | Shida et al. | |
| 2008/0265752 A1 | 10/2008 | Meijer et al. | |
| 2009/0014749 A1 | 1/2009 | Matsuda | |
| 2009/0015149 A1 | 1/2009 | Lee et al. | |
| 2009/0045733 A1* | 2/2009 | Suh | H01L 27/3276 313/504 |
| 2009/0050907 A1 | 2/2009 | Yuan et al. | |
| 2009/0068774 A1 | 3/2009 | Slater et al. | |
| 2009/0114934 A1 | 5/2009 | Horng et al. | |
| 2009/0217517 A1 | 9/2009 | Pique et al. | |
| 2009/0284501 A1 | 11/2009 | Nathan et al. | |
| 2009/0314991 A1 | 12/2009 | Cho et al. | |
| 2010/0022039 A1 | 1/2010 | Chang | |
| 2010/0051910 A1 | 3/2010 | Choi | |
| 2010/0188794 A1 | 7/2010 | Park et al. | |
| 2010/0193822 A1 | 8/2010 | Inobe et al. | |
| 2010/0213467 A1 | 8/2010 | Lee et al. | |
| 2010/0248484 A1 | 9/2010 | Bower et al. | |
| 2010/0270567 A1 | 10/2010 | Emerson et al. | |
| 2010/0295078 A1 | 11/2010 | Chen et al. | |
| 2011/0003410 A1 | 1/2011 | Tsay et al. | |
| 2011/0057866 A1 | 3/2011 | Konicek | |
| 2011/0068674 A1 | 3/2011 | Takenaka et al. | |
| 2011/0073838 A1 | 3/2011 | Khan et al. | |
| 2011/0084291 A1 | 4/2011 | Jeong et al. | |
| 2011/0114969 A1 | 5/2011 | Lee et al. | |
| 2011/0169429 A1 | 7/2011 | Ing et al. | |
| 2011/0198598 A1 | 8/2011 | Kim et al. | |
| 2011/0266561 A1 | 11/2011 | Rogers et al. | |
| 2011/0284867 A1 | 11/2011 | Tran et al. | |
| 2011/0291151 A1 | 12/2011 | Matsuda | |
| 2012/0018746 A1 | 1/2012 | Hsieh | |
| 2012/0064642 A1 | 3/2012 | Huang et al. | |
| 2012/0134065 A1 | 5/2012 | Furuya et al. | |
| 2012/0146030 A1 | 6/2012 | You et al. | |
| 2012/0168714 A1 | 7/2012 | Chu et al. | |
| 2012/0168776 A1 | 7/2012 | Nakamura et al. | |
| 2012/0205689 A1 | 8/2012 | Welch et al. | |
| 2012/0223875 A1 | 9/2012 | Lau et al. | |
| 2012/0326188 A1 | 12/2012 | Han | |
| 2013/0126081 A1 | 5/2013 | Hu et al. | |
| 2013/0126891 A1 | 5/2013 | Bibl et al. | |
| 2013/0187179 A1 | 7/2013 | Tan et al. | |
| 2013/0210194 A1 | 8/2013 | Bibl et al. | |
| 2013/0234115 A1 | 9/2013 | Song et al. | |
| 2013/0285086 A1 | 10/2013 | Hu et al. | |
| 2014/0027709 A1 | 1/2014 | Higginson et al. | |
| 2014/0084240 A1 | 3/2014 | Hu et al. | |
| 2014/0084482 A1 | 3/2014 | Hu et al. | |
| 2014/0159064 A1 | 6/2014 | Sakariya et al. | |

FOREIGN PATENT DOCUMENTS

| | | | |
|---|---|---|---|
| JP | 2004-303706 A | 10/2004 | |
| JP | 2007-173408 A | 7/2007 | |
| KR | 2010-0089115 A | 8/2010 | |
| KR | 10-1051488 B1 | 7/2011 | |
| WO | WO 98-48319 A1 | 10/1998 | |
| WO | WO 03/012884 A1 | 2/2003 | |
| WO | WO 2011/102030 A1 | 8/2011 | |
| WO | WO 2011/123285 | 10/2011 | |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID Oct. 8-12, 2006, New Delhi, pp. 53-58.

(56) References Cited

OTHER PUBLICATIONS

Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Medtronic Energy and Components Center, 10 pgs.
Lee, San Youl, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low-Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.
Geffroy, et al., "Organic light-emitting diode (OLED) technology: materials, devices and display technologies," 2006 Society of Chemical Industry, pp. 572-582.
Gohda, et al., "58.3: A 3.6-in. 202-ppi Full-Color AMPLED Display Fabricated by Ink-Jet Method," 2006 SID Digest, pp. 1767-1770.
Ohara, et al., "4.0-inch Active-Matrix Organic Light-Emitting Diode Display Integrated with Driver Circuits Using Amorphous In—Ga—Zn—Oxide Thin-Film Transistors with Suppressed Variation," 2010 The Japan Society of Applied Physics, pp. 1-6.
Hekmatshoar, et al., "A novel TFT-OLED integration for OLED-independent pixel programming in amorphous-Si AMOLED pixels," 2008, Society for Information Display, Journal of the SID 16/1, pp. 183-188.
Sarma, et al., "Active Matrix OLED Using 150° C. a-Si TFT Backplane Built on Flexible Plastic Substrate," SPIE Symp. on Aerospace/Defense Sending, Orlando, FL, Apr. 2003, and to be published in SPIE Proc., vol. 5080, paper 24 (2003), 12 pgs.
"Optical Coating," Wikipedia.org. Retrieved by Examiner from http://en.wikipedia.org/wiki/Optical_coating May 27, 2014, 6 pages.
Notification Concerning Transmittal of Preliminary Report on Patentability for International Application No. PCT/US2013/072913, mailed Jun. 25, 2015, 8 pages.
PCT International Search Report and Written Opinion for International Application No. PCT/US2013/072913, mailed Mar. 25, 2014, 11 pages.
Notification Concerning Transmittal of Preliminary Report on Patentability for International Application No. PCT/US2013/072914, mailed Jun. 25, 2015, 9 pages.
PCT International Search Report and Written Opinion for International Application No. PCT/US2013/072914, mailed Mar. 24, 2014, 11 pages.
Notification Concerning Transmittal of Preliminary Report on Patentability for International Application No. PCT/US2013/072916, mailed Jun. 25, 2015, 9 pages.
PCT International Search Report and Written Opinion for International Application No. PCT/US2013/072916, mailed Mar. 27, 2014, 12 pages.

* cited by examiner

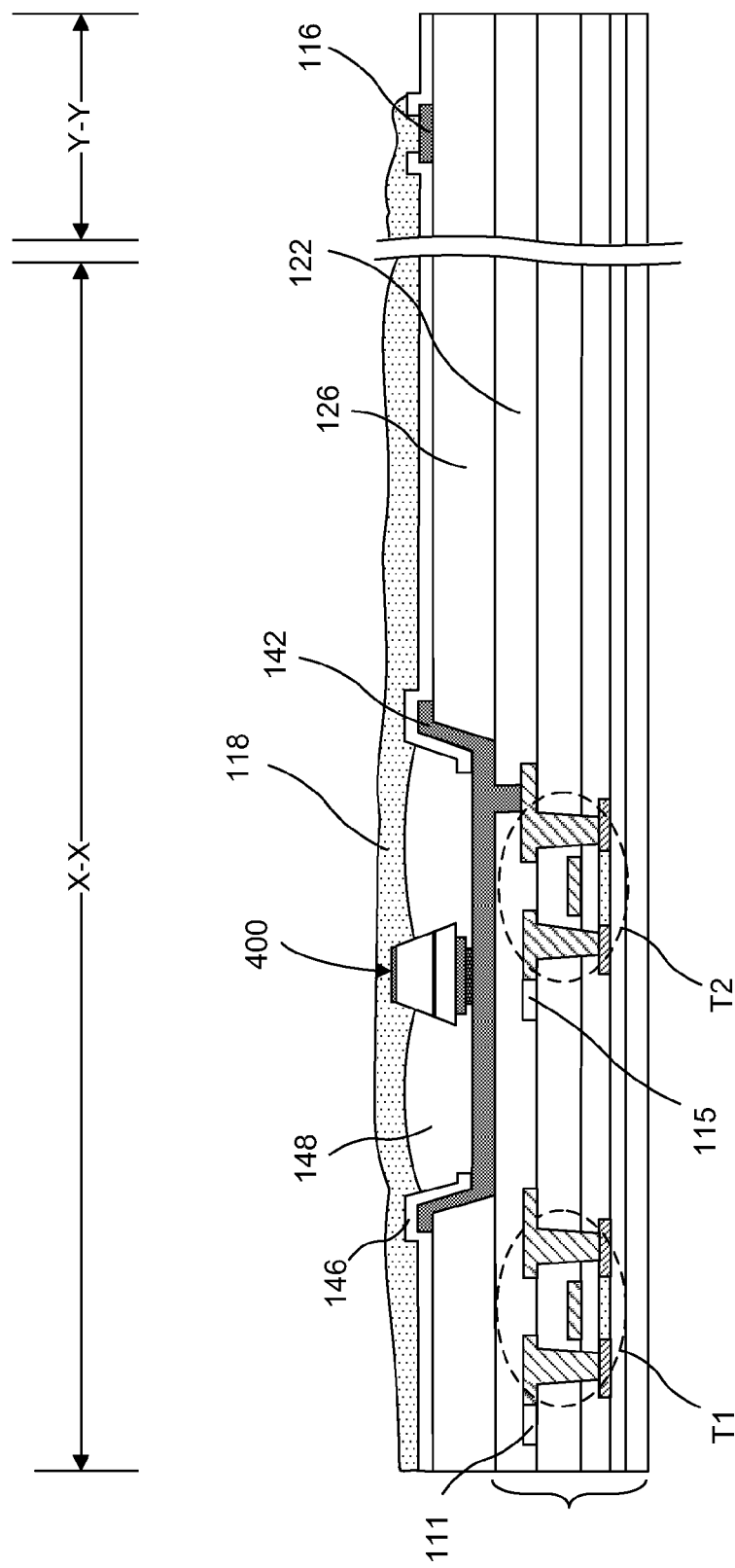

ACTIVE MATRIX EMISSIVE MICRO LED DISPLAY

RELATED APPLICATIONS

This application is a continuation application of co-pending U.S. patent application Ser. No. 13/842,721, filed Mar. 15, 2013, which is a continuation-in-part of co-pending U.S. patent application Ser. No. 13/710,443 filed on Dec. 10, 2012, both of which are incorporated herein by reference.

BACKGROUND

1. Field

Embodiments of the present invention relate to display systems. More particularly embodiments of the present invention relate to a grounding structure for an active matrix display panel.

2. Background Information

Flat panel displays are gaining popularity in a wide range of electronic devices. Common types of flat panel displays include active matrix displays and passive matrix displays. Each pixel in an active matrix display panel is driven by active driving circuitry, while each pixel in a passive matrix display panel does not use such driving circuitry. High-resolution color display panels, such as modern computer displays, smart phones and televisions typically use an active matrix display panel structure for better image quality.

One kind of display panel that is finding commercial application is an active matrix organic light emitting diode (AMOLED) display panel. FIG. 1 is a top view illustration of a top emission AMOLED display panel. FIG. 2 is a cross-sectional side view illustration of FIG. 1 taken along line X-X in the pixel area 104 and line Y-Y crossing the ground ring 116 in the non-pixel area. The AMOLED display panel 100 illustrated in FIGS. 1-2 generally includes a thin film transistor (TFT) substrate 102 supporting a pixel area 104 and non-pixel area outside of the pixel area 102. A TFT substrate 102 is also referred to as a backplane. A TFT substrate which has been further processed to additionally include the pixel area and non-pixel area is also often referred to as a backplane. Two primary TFT substrate technologies used in AMOLEDs include polycrystalline silicon (poly-Si) and amorphous silicon (a-Si). These technologies offer the potential for fabricating the active matrix backplanes at low temperatures (below 200° C.) directly onto flexible plastic substrates for producing flexible AMOLED displays. The pixel area 104 generally includes pixels 106 and subpixels 108 arranged in a matrix, and a set of TFTs and capacitors connected to each subpixel for driving and switching the subpixels. The non-pixel area generally includes a data driver circuit 110 connected to a data line of each subpixel to enable data signals (Vdata) to be transmitted to the subpixels, a scan driver circuit 112 connected to scan lines of the subpixels to enable scan signals (Vscan) to be transmitted to the subpixels, a power supply line 114 to transmit a power signal (Vdd) to the TFTs, and a ground ring 116 to transmit a ground signal (Vss) to the array of subpixels. As shown, the data driver circuit, scan driver circuit, power supply line, and ground ring are all connected to a flexible circuit board (FCB) 113 which includes a power source for supplying power to the power supply line 114 and a power source ground line electrically connected to the ground ring 116.

In the exemplary AMOLED backplane configuration an organic thin film 120 and top electrode 118 are deposited over every subpixel 108 in the pixel area 104. The organic thin film 120 may include multiple layers such as a hole injection layer, hole transport layer, light emitting layer, electron transport layer, and electron injection layer. The multiple layers of the organic thin film 120 are typically formed over the entire pixel area 104, however, the light emitting layer is often deposited with aid of a shadow mask only within the subpixel openings 127 and on the bottom electrode layer 124 corresponding to the emission area for the array of subpixels 108. A top electrode layer 118 is then deposited over the organic thin film within both the pixel area 104 and also within the non-pixel area so that the top electrode 118 layer overlaps the ground ring 116 in the in order to transfer the ground signal to the array of subpixels. In this manner, each of the subpixels 108 can be individually addressed with the corresponding underlying TFT circuitry while a uniform ground signal is supplied to the top of the pixel area 104.

In the particular implementation illustrated, the TFT substrate 102 includes a switching transistor T1 connected to a data line 111 from the data driver circuit 110 and a driving transistor T2 connected to a power line 115 connected to the power supply line 114. The gate of the switching transistor T1 may also be connected to a scan line (not illustrated) from the scan driver circuit 112. A planarization layer 122 is formed over the TFT substrate, and openings are formed to expose the TFT working circuitry. As illustrated, a bottom electrode layer 124 is formed on the planarization layer in electrical connection with the TFT circuitry. Following the formation of the electrode layer a pixel defining layer 125 is formed including an array of subpixel openings 127 corresponding to the emission area for the array of subpixels 108, followed by deposition of the organic layer 120 and top electrode layer 118 over the patterned pixel defining layer, and within subpixel openings 127 of the patterned pixel defining layer 125. The top electrode layer 118 additionally is formed in the non-pixel area and in electrical connection with the ground ring 116.

The planarization layer 122 may function to prevent (or protect) the organic layer 120 and the bottom electrode layer 124 from shorting due to a step difference. Exemplary planarization layer 122 materials include benzocyclobutene (BCB) and acrylic. The pixel defining layer 125 can be formed of a material such as polyimide. The bottom electrode 124 is commonly formed on indium tin oxide (ITO), ITO/Ag, ITO/Ag/ITO, ITO/Ag/indium zinc oxide (IZO), or ITO/Ag alloy/ITO. The top electrode layer 118 is formed of a transparent material such as ITO for top emission.

While AMOLED display panels generally consume less power than liquid crystal display (LCD) panels, an AMOLED display panel can still be the dominant power consumer in battery-operated devices. To extend battery life, it is necessary to reduce the power consumption of the display panel.

SUMMARY OF THE INVENTION

A display panel and a method of forming a display panel are described. In an embodiment a display panel includes a TFT substrate including a pixel area and a non-pixel area. For example, the non-pixel area may surround the pixel area. The pixel area includes an array of bank openings and an array of bottom electrodes within the array of bank openings. The array of bottom electrodes may be formed on sidewalls of the corresponding array of bank openings, and may be reflective to the visible wavelength. In an embodiment a post of solder material is formed on the bottom electrode within each bank opening in order to aid the bonding of a micro LED device to the bottom electrode. A ground line is formed in the non-pixel area. In an embodiment, the ground line is a ground ring. In an embodiment a patterned insulator layer covers the array of bottom electrodes, and an array of openings is formed in the patterned insulator exposing the array of bottom electrodes. In this manner, the patterned insulator layer may cover the edges of the array of bottom electrodes.

In an embodiment, an array of micro LED devices are on the array of bottom electrodes within the corresponding array of bank openings. For example, the micro LED devices may be vertical micro LED devices, and may have a maximum width of 1 μm-100 μm. A transparent passivation layer can be formed spanning sidewalls of the array of micro LED devices without completely covering a top conductive contact of each micro LED device. In an embodiment, an array of top electrode layers are formed over the array of micro LED devices electrically connecting the array of micro LED devices to the ground line. For example, each top electrode layer may span over a single row of micro LED devices. Each top electrode may span over a plurality of rows of micro LED devices. In an embodiment, the each top electrode layer is electrically connected to the ground ring on opposite sides of the pixel area. The top electrode layers may also be formed of a transparent or semi-transparent material such as PEDOT or ITO.

In an embodiment, a method of forming a display panel includes transferring an array of micro LED devices from a carrier substrate to a backplane that comprises a TFT substrate including a pixel area and a non-pixel area, where the pixel area includes an array of bank openings and an array of bottom electrodes within the array of bank openings. The TFT substrate also includes a ground line in the non-pixel area. In an embodiment, an array of separate top electrode layers are formed over the array micro LED devices electrically connecting the array of micro LED devices to the ground line. In an embodiment, top electrode layers are formed by ink jet printing or screen printing. In an embodiment, the ground line is a ground ring and the array of separate top electrode layers span between opposite sides of the ground ring. In accordance with embodiments of the invention, each top electrode layer may span over one or more rows of micro LED devices. For example, each top electrode layer may span over a single row of micro LED device, or may span over a plurality of rows of micro LED devices. It is not required for the top electrode layers to completely cover the pixel area of the TFT substrate.

In an embodiment, transfer of the array of micro LED device is performed with electrostatic principles using an array of electrostatic transfer heads. Furthermore, bonding of the array of micro LED devices may include the formation of an inter-metallic compound, and may include liquefying an array of bonding layers formed on the array of bottom electrodes. Bonding and liquefying may be accomplished in part by the transfer of thermal energy from the array of electrostatic transfer heads to the array of bonding layers formed on the array of bottom electrodes.

BRIEF DESCRIPTION OF THE DRAWINGS

FIG. 6C is a side-view illustration of the active matrix display panel of either FIG. 6A or FIG. 6B taken along lines X-X and Y-Y in accordance with an embodiment of the invention.

DETAILED DESCRIPTION OF THE INVENTION

Figure 1:
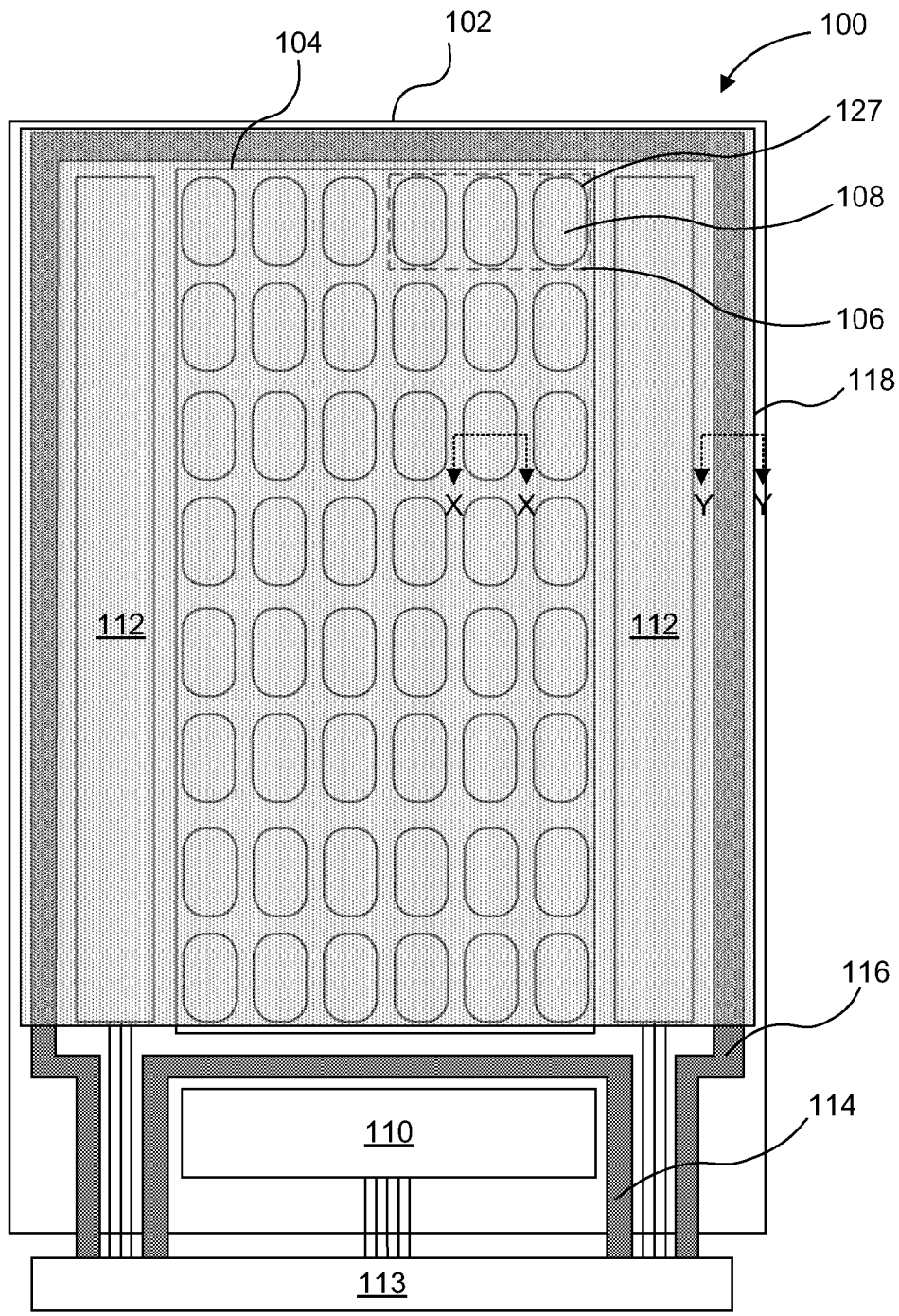
FIG. 1 is a top view illustration of a top emission AMOLED display panel.

Embodiments of the present invention relate to display systems. More particularly embodiments of the present invention relate to an active matrix display panel including emissive micro LEDs.

In one aspect, embodiments of the invention describe an active matrix display panel including wafer-based emissive micro LED devices. A micro LED device combines the performance, efficiency, and reliability of wafer-based LED devices with the high yield, low cost, mixed materials of thin film electronics used to form AMOLED backplanes. The terms "micro" device or "micro" LED structure as used herein may refer to the descriptive size of certain devices or structures in accordance with embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales. In an embodiment, a display panel is similar to a typical OLED display panel, with a micro LED device having replaced the organic layer of the OLED display panel in each subpixel. Exemplary micro LED devices which may be utilized with some embodiments of the invention are described in U.S. patent application Ser. No. 13/372,222, U.S. patent application Ser. No. 13/436,260, U.S. patent application Ser. No. 13/458,932, U.S. patent application Ser. No. 13/711,554, and U.S. patent application Ser. No. 13/749,647 all of which are incorporated herein by reference. The micro LED devices are highly efficient at light emission and consume very little power (e.g., 250 mW for a 10 inch diagonal display) compared to 5-10 watts for a 10 inch diagonal LCD or OLED display, enabling reduction of power consumption of the display panel.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over" or "on" another layer or bonded "to" or in "contact" with another layer may be directly in contact with the other layer or may have one or more intervening layers. One layer "between" layers may be directly in contact with the layers or may have one or more intervening layers.

Figure 2:
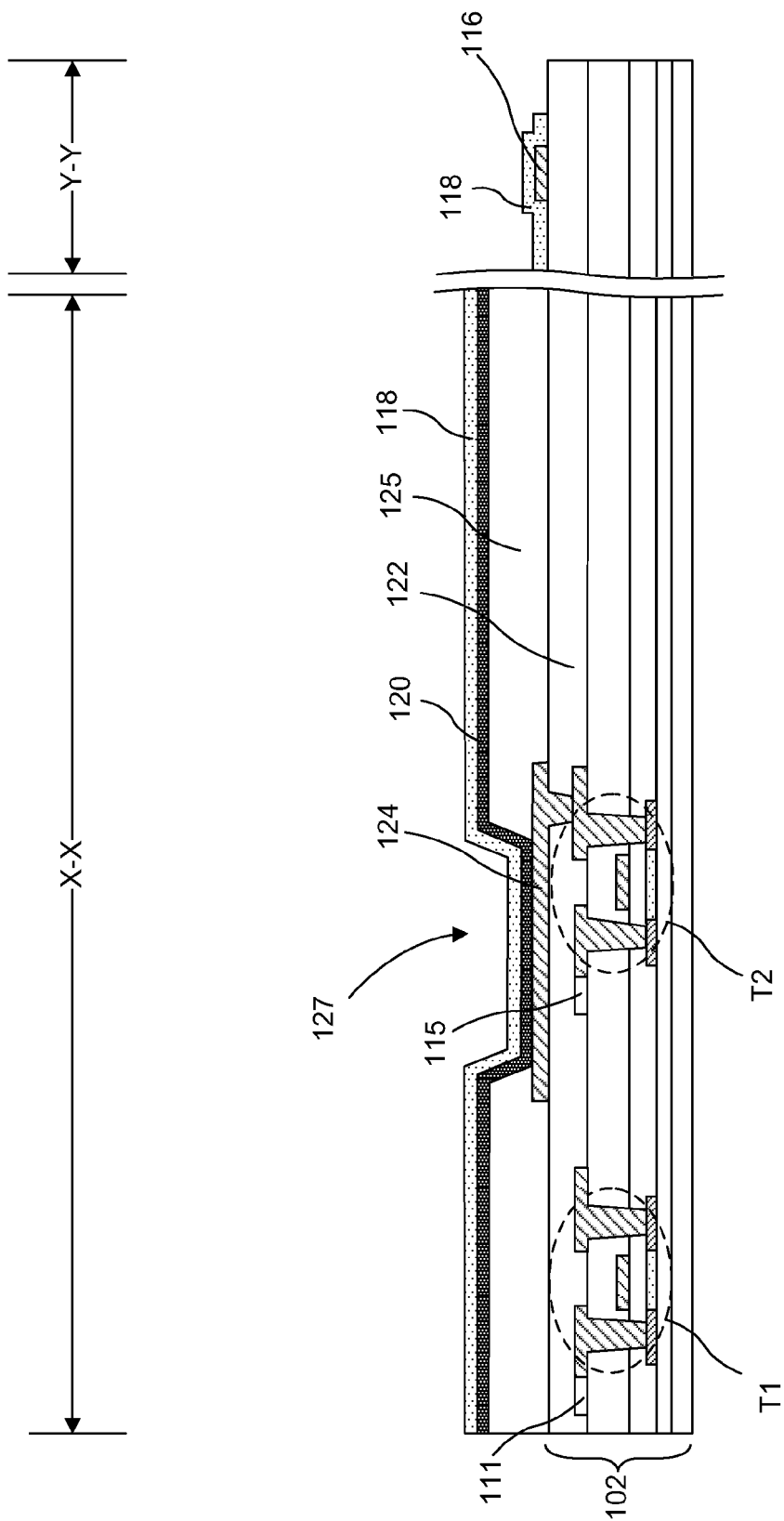
FIG. 2 is a side-view illustration of the top emission AMOLED display panel of FIG. 1 taken along lines X-X and Y-Y.
Figure 3A:
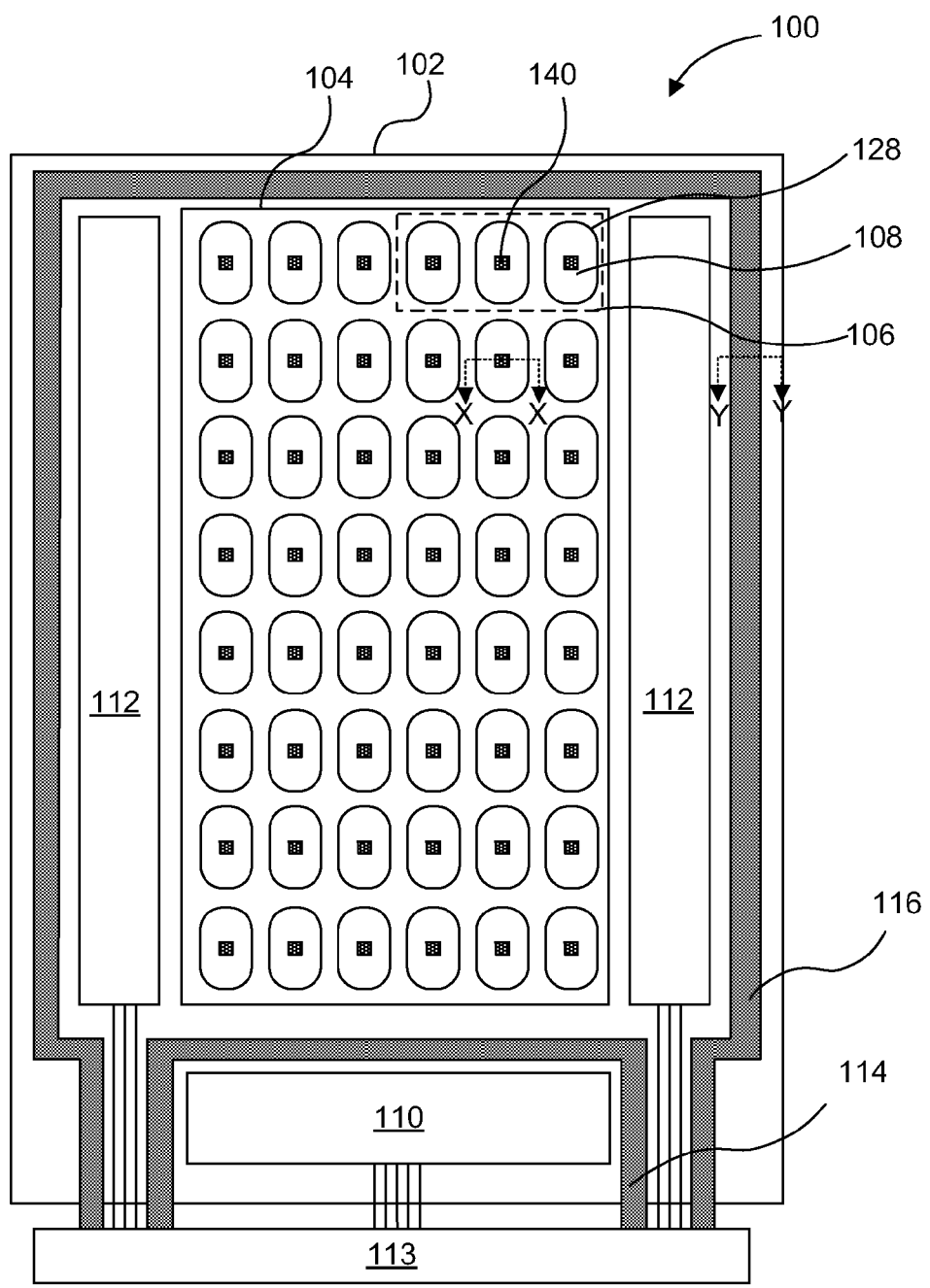
FIG. 3A is a top view illustration of an active matrix display panel in accordance with an embodiment of the invention.
Figure 3B:
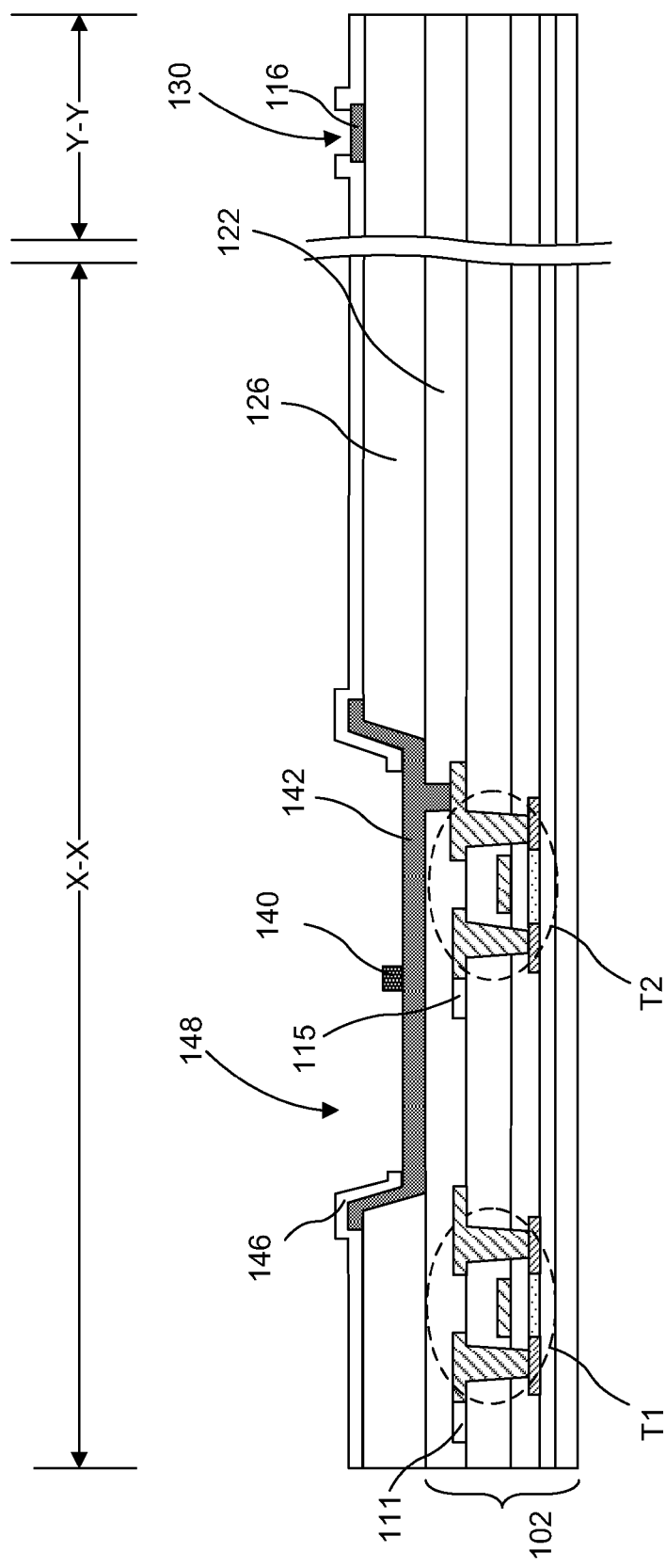
FIG. 3B is a side-view illustration of the active matrix display panel of FIG. 3A taken along lines X-X and Y-Y in accordance with an embodiment of the invention.

Referring now to FIGS. 3A-3B an embodiment is illustrated in which a backplane similar to an AMOLED backplane is modified to receive emissive micro LED devices rather than an organic emission layer. FIG. 3A is a top view illustration of an active matrix display panel in accordance with an embodiment, and FIG. 3B is a side-view illustration of the active matrix display panel of FIG. 3A taken along lines X-X and Y-Y in accordance with an embodiment of the invention. In such an embodiment, the underlying TFT substrate 102 can be similar to those in a typical AMOLED backplane described with regard to FIGS. 1-2 including working circuitry (e.g. T1, T2) and planarization layer 122. Openings 131 may be formed in the planarization layer 122 to contact the working circuitry. The working circuitry can include traditional 2T1C (two transistors, one capacitor) circuits including a switching transistor, a driving transistor, and a storage capacitor. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for process variations of the driver transistor and the light emitting device, or for their instabilities. Furthermore, while embodiments of the invention are described and illustrated with regard to top gate transistor structures in the TFT substrate 102, embodiments of the invention also contemplate the use of bottom gate transistor structures. Likewise, while embodiments of the invention are described and illustrated with regard to a top emission structure, embodiments of the invention also contemplate the use of bottom, or both top and bottom emission structures. In addition, embodiments of the invention are described and illustrated below specifically with regard to a high side drive configuration including a ground ring. In a high side drive configuration a LED may be on the drain side of a PMOS driver transistor or a source side of an NMOS driver transistor so that the circuit is pushing current through the p-terminal of the LED. Embodiments of the invention are not so limited may also be practiced with a low side drive configuration in which case the ground ring become the power line in the panel and current is pulled through the n-terminal of the LED.

A patterned bank layer 126 including bank openings 148 is then formed over the planarization layer 122. Bank layer 126 may be formed by a variety of techniques such as ink jet printing, screen printing, lamination, spin coating, CVD, and PVD. Bank layer 126 may be may be opaque, transparent, or semi-transparent to the visible wavelength. Bank layer 126 may be formed of a variety of insulating materials such as, but not limited to, photodefinable acrylic, photoresist, silicon oxide ($SiO_2$), silicon nitride ($SiN_x$), poly(methyl methacrylate) (PMMA), benzocyclobutene (BCB), polyimide, acrylate, epoxy, and polyester. In an embodiment, bank player is formed of an opaque material such as a black matrix material. Exemplary insulating black matrix materials include organic resins, glass pastes, and resins or pastes including a black pigment, metallic particles such as nickel, aluminum, molybdenum, and alloys thereof, metal oxide particles (e.g. chromium oxide), or metal nitride particles (e.g. chromium nitride).

In accordance with embodiments of the invention, the thickness of the bank layer 126 and width of the bank openings 128 described with regard to the following figures may depend upon the height of the micro LED device to be mounted within the opening, height of the transfer heads transferring the micro LED devices, and resolution. In an embodiment, the resolution, pixel density, and subpixel density of the display panel may account for the width of the bank openings 128. For an exemplary 55 inch television with a 40 PPI (pixels per inch) and 211 μm subpixel pitch, the bank opening 128 width may be anywhere from a few microns to 206 μm to account for an exemplary 5 μm wide surrounding bank structure. For an exemplary display panel with 440 PPI and a 19 μm subpixel pitch, the bank opening 128 width may be anywhere from a few microns to 15 μm to account for an exemplary 5 μm wide surrounding bank structure. Width of the bank structure (i.e. between bank openings 128) may be any suitable size, so long as the structure supports the required processes and is scalable to the required PPI.

In accordance with embodiments of the invention, the thickness of the bank layer 126 is not too thick in order for the bank structure to function. Thickness may be determined by the micro LED device height and a predetermined viewing angle. For example, where sidewalls of the bank openings 128 make an angle with the planarization layer 122, shallower angles may correlate to a wider viewing angle of the system. In an embodiment, exemplary thicknesses of the bank layer 126 may be between 1 μm-50 μm.

A patterned conductive layer is then formed over the patterned bank layer 126. Referring to FIG. 3B, in one embodiment the patterned conductive layer includes bottom electrodes 142 formed within the bank openings 148 and in electrical contact with the working circuitry. The patterned conductive layer may also optionally include the ground ring 116. As used herein the term ground "ring" does not require a circular pattern, or a pattern that completely surrounds an object. Rather, the term ground "ring" means a pattern that at least partially surrounds the pixel area on three sides. In addition, while the following embodiments are described and illustrated with regard to a ground ring 116, it is to be appreciated that embodiments of the invention can also be practiced with a ground line running along one side (e.g. left, right, bottom, top), or two sides (a combination of two of the left, right, bottom, top) of the pixel area. Accordingly, it is to be appreciated that in the following description the reference to and illustration of a ground ring could potentially be replaced with a ground line where system requirements permit.

The patterned conductive layer may be formed of a number of conductive and reflective materials, and may include more than one layer. In an embodiment, a patterned conductive layer comprises a metallic film such as aluminum, molybdenum, titanium, titanium-tungsten, silver, or gold, or alloys thereof. The patterned conductive layer may include a conductive material such as amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the patterned conductive layer includes a stack of a conductive material and a reflective conductive material. In an embodiment, the patterned conductive layer includes a 3-layer stack including top and bottom layers and a reflective middle layer wherein one or both of the top and bottom layers are transparent. In an embodiment, the patterned conductive layer includes a conductive oxide-reflective metal-conductive oxide 3-layer stack. The conductive oxide layers may be transparent. For example, the patterned conductive layer may include an ITO-silver-ITO layer stack. In such a configuration, the top and bottom ITO layers may prevent diffusion and/or oxidation of the reflective metal (silver) layer. In an embodiment, the patterned conductive layer includes a Ti—Al—Ti stack, or a Mo—Al—Mo—ITO stack. In an embodiment, the patterned conductive layer includes a ITO—Ti—Al—Ti—ITO stack. In an embodiment, the patterned conductive layer is 1 µm or less in thickness. The patterned conductive layer may be deposited using a suitable technique such as, but not limited to, PVD.

Following the formation of bottom electrodes 142 and ground ring 116, an insulator layer 146 may then optionally be formed over the TFT substrate 102 covering the sidewalls of the pattered conductive layer. The insulator layer 146 may at least partially cover the bank layer 126 and the reflective layer forming the bottom electrodes 142, and optionally the ground ring 116.

In an embodiment, the insulator layer 146 is formed by blanket deposition using a suitable technique such as lamination, spin coating, CVD, and PVD, and then patterned using a suitable technique such as lithography to form openings exposing the bottom electrodes 142, and optionally openings 130 exposing the ground ring 116. In an embodiment, ink jet printing or screen printing may be used to form the insulator layer 146 and optionally openings 130 without requiring lithography. Insulator layer 146 may be formed of a variety of materials such as, but not limited to, SiO$_2$, SiN$_x$, PMMA, BCB, polyimide, acrylate, epoxy, and polyester. For example, the insulator layer 146 may be 0.5 µm thick. The insulator layer 146 may be transparent or semi-transparent where formed over the reflective layer on sidewalls of bottom electrode 142 within the bank openings 128 as to not significantly degrade light emission extraction of the completed system. Thickness of the insulator layer 146 may also be controlled to increase light extraction efficiency, and also to not interfere with the array of transfer heads during transfer of the array of light emitting devices to the reflective bank structure. As will become more apparent in the following description, the patterned insulator layer 146 is optional, and represents one manner for electrically separating, or passivating the sidewalls of conductive layers.

Figure 3C:
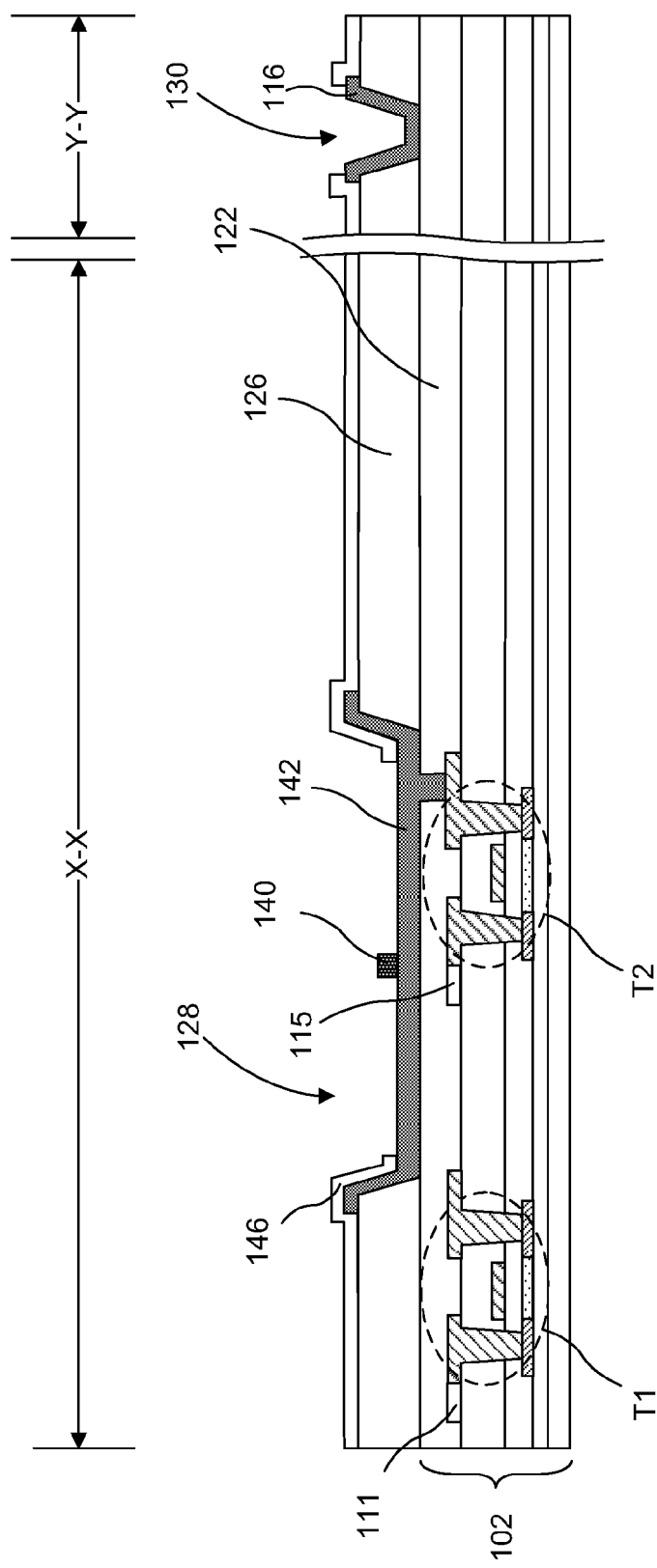
FIG. 3C is a side-view illustration of the active matrix display panel of FIG. 3A taken along lines X-X and Y-Y in accordance with an embodiment of the invention in which a ground ring is formed within a patterned bank layer.
Figure 3D:
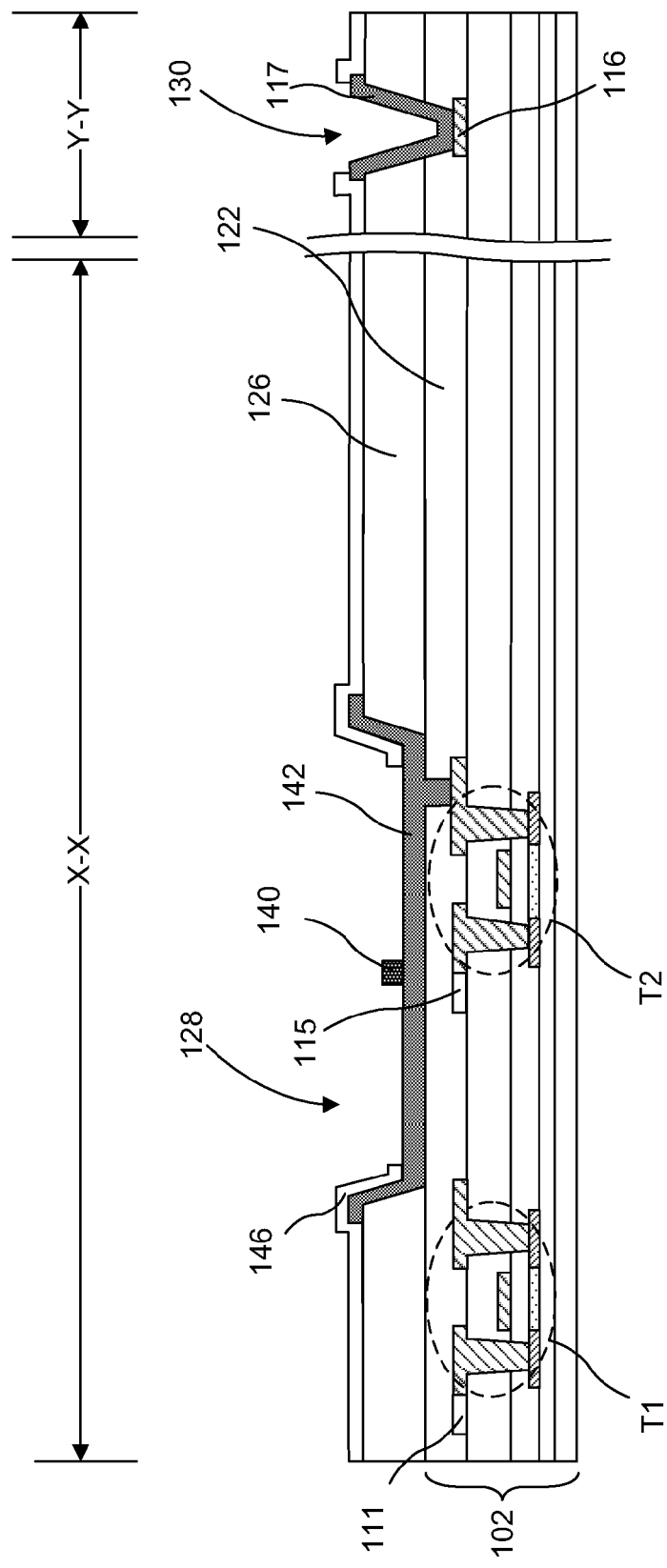
FIG. 3D is a side-view illustration of the active matrix display panel of FIG. 3A taken along lines X-X and Y-Y in accordance with an embodiment of the invention in which a ground ring is formed below a patterned bank layer.

In the embodiment illustrated in FIG. 3B, the bottom electrodes 142 and ground ring 116 can be formed of the same conductive layer. In another embodiment, the ground ring 116 can be formed of a conductive material different from the bottom electrodes 142. For example, ground ring 116 may be formed with a material having a higher conductivity than the bottom electrodes 142. In another embodiment, ground ring 116 can also be formed within different layers from the bottom electrodes. FIGS. 3C-3D illustrate embodiments where the ground ring 116 can be formed within or below the patterned bank layer 126. For example, in the embodiment illustrated in FIG. 3C, openings 130 may be formed through the patterned bank layer 126 when forming the ground ring 116. In the embodiment illustrated in FIG. 3D, openings 130 may be formed through the patterned bank layer 126 and planarization layer 122 to contact the ground ring 116 which may have been formed during formation of the working circuitry of the TFT substrate 102. In such an embodiment the conductive layer used to form the bottom electrode 142 may also optionally also be formed within the opening 130 to further enable electrical contact of the top electrode layer yet to be formed with the ground ring 116 through openings 130. Accordingly, it is to be appreciated that the embodiments illustrated in FIGS. 3A-3D are not limiting and that a number of possibilities exist for forming the ground ring 116, as well as openings 130 to expose the ground ring 116.

Still referring to embodiments illustrated in FIG. 3B-3D, a bonding layer 140 may be formed on the bottom electrode layer 142 to facilitate bonding of a micro LED device. In an embodiment, the bonding layer 140 is selected for its ability to be inter-diffused with a bonding layer on the micro LED device (yet to be placed) through bonding mechanisms such as eutectic alloy bonding, transient liquid phase bonding, or solid state diffusion bonding as described in U.S. patent application Ser. No. 13/749,647. In an embodiment, the bonding layer 140 has a melting temperature of 250° C. or lower. For example, the bonding layer 140 may include a solder material such as tin (232° C.) or indium (156.7° C.), or alloys thereof. Bonding layer 140 may also be in the shape of a post, having a height greater than width. In accordance with some embodiments of the invention, taller bonding layers 140 may provide an additional degree of freedom for system component leveling, such as planarity of the array of micro LED devices with the TFT substrate during the micro LED device transfer operation and for variations in height of the micro LED devices, due to the change in height of the liquefied bonding layers as they spread out over the surface during bonding, such as during eutectic alloy bonding and transient liquid phase bonding. The width of the bonding layers 140 may be less than a width of a bottom surface of the micro LEDs to prevent wicking of the bonding layers 140 around the sidewalls of the micro LEDs and shorting the quantum well structures.

Figure 4A:
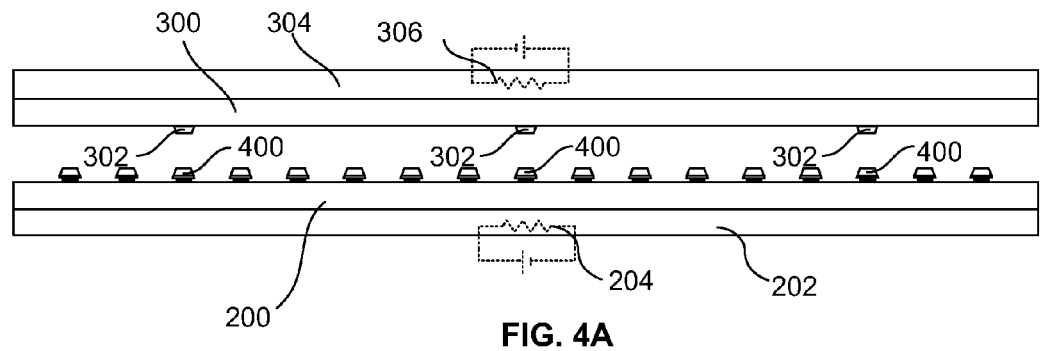
FIGS. 4A-4H are cross-sectional side view illustrations for a method of transferring an array of micro LED devices to a TFT substrate in accordance with an embodiment of the invention.
Figure 4B:
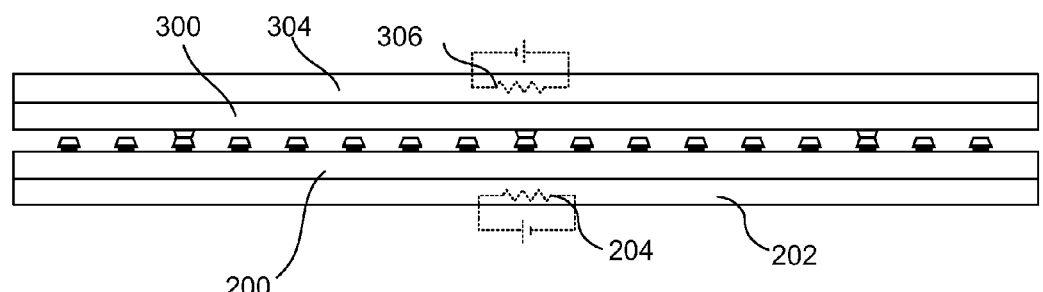
Figure 4C:
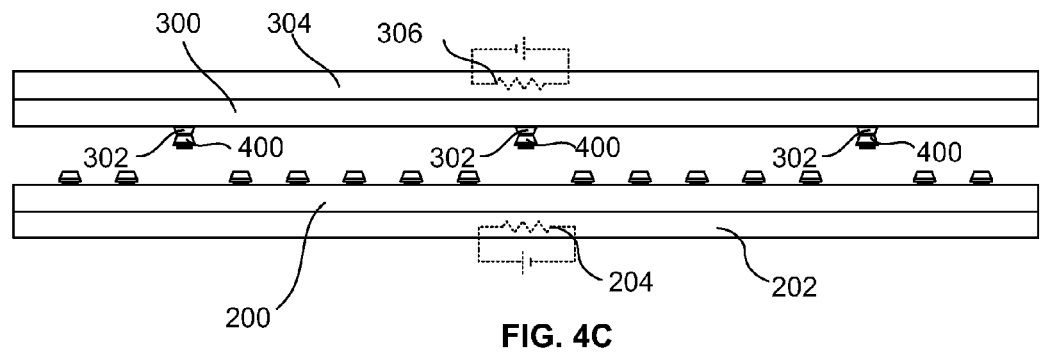

FIGS. 4A-4H are cross-sectional side view illustrations for a method of transferring an array of micro LED devices to the TFT substrate 102 in accordance with an embodiment of the invention. Referring to FIG. 4A, an array of transfer heads 302 supported by a transfer head substrate 300 are positioned over an array of micro LED devices 400 supported on a carrier substrate 200. A heater 306 and heat distribution plate 304 may optionally be attached to the transfer head substrate 300. A heater 204 and heat distribution plate 202 may optionally be attached to the carrier substrate 200. The array of micro LED devices 400 are contacted with the array of transfer heads 302, as illustrated in FIG. 4B, and picked up from the carrier substrate 200 as illustrated in FIG. 4C. In an embodiment, the array of micro LED devices 400 are picked up with an array of transfer heads 302 operating in accordance with electrostatic principles, that is, they are electrostatic transfer heads.

Figure 4D:
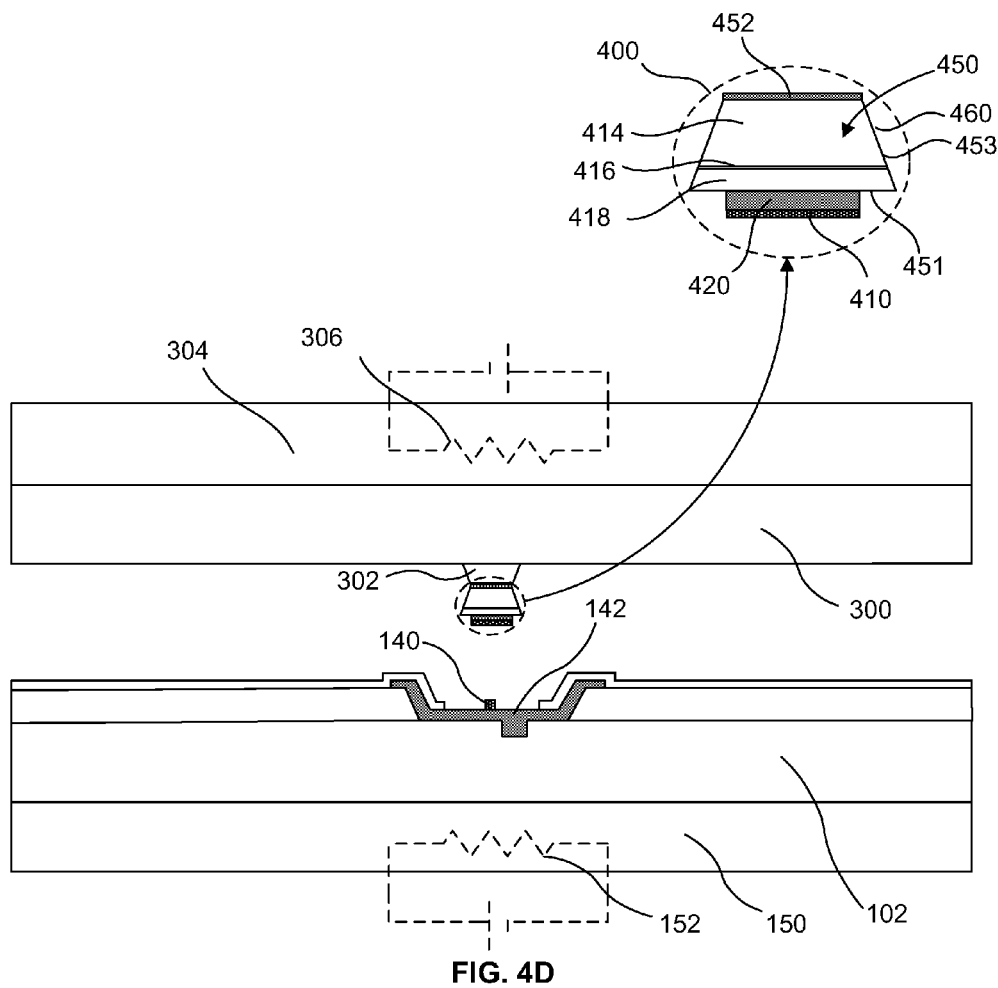

FIG. 4D is a cross-sectional side view illustration of a transfer head 302 holding a micro LED device 400 over a TFT substrate 102 in accordance with an embodiment of the invention. In the embodiment illustrated, the transfer head 302 is supported by a transfer head substrate 300. As described above, a heater 306 and heat distribution plate 304 may optionally be attached to the transfer head substrate to apply heat to the transfer head 302. A heater 152 and heat distribution plate 150 may also, or alternatively, optionally be used to transfer heat to the bonding layer 140 on the TFT substrate 102 and/or optional bonding layer 410 on a micro LED device 400 described below.

Still referring to FIG. 4D, a close-up view of an exemplary micro LED device 400 is illustrated in accordance with an embodiment. It is to be appreciated, that the specific micro LED device 400 illustrated is exemplary and that embodiments of the invention are not limited. In the particular embodiment illustrated, the micro LED device 400 includes a micro p-n diode 450 and a bottom conductive contact 420. A bonding layer 410 may optionally be formed below the bottom conductive contact 420, with the bottom conductive contact 420 between the micro p-n diode 450 and the bonding layer 410. In an embodiment, the micro LED device 400 further includes a top conductive contact 452. In an embodiment, the micro p-n diode 450 includes a top n-doped layer 414, one or more quantum well layers 416, and a lower p-doped layer 418. In other embodiments, the arrangement of n-doped and p-doped layers can be reversed. The micro p-n diodes can be fabricated with straight sidewalls or tapered sidewalls. In certain embodiments, the micro p-n diodes 450 possess outwardly tapered sidewalls 453 (from top to bottom). In certain embodiments, the micro p-n diodes 450 possess inwardly tapered sidewall (from top to bottom). The top and bottom conductive contacts 420, 452. For example, the bottom conductive contact 420 may include an electrode layer and a barrier layer between the electrode layer and the optional bonding layer 410. The top and bottom conductive contacts 420, 452 may be transparent to the visible wavelength range (e.g. 380 nm-750 nm) or opaque. The top and bottom conductive contacts 420, 452 may optionally include a reflective layer, such as a silver layer. The micro p-n diode and conductive contacts may each have a top surface, a bottom surface and sidewalls. In an embodiment, the bottom surface 451 of the micro p-n diode 450 is wider than the top surface of the micro p-n diode, and the sidewalls 453 are tapered outwardly from top to bottom. The top surface of the micro p-n diode 450 may be wider than the bottom surface of the p-n diode, or approximately the same width. In an embodiment, the bottom surface 451 of the micro p-n diode 450 is wider than the top surface of the bottom conductive contact 420. The bottom surface of the micro p-n diode may also be approximately the same width as the top surface of the bottom conductive contact 420. In an embodiment, the micro p-n diode 450 is several microns thick, such as 3 µm or 5 µm, the conductive contacts 420, 452 are 0.1 µm-2 µm thick, and the optional bonding layer 410 is 0.1 µm-1 µm thick. In an embodiment, a maximum width of each micro LED device 400 is 1-100 µm, for example, 30 µm, 10 µm, or 5 µm. In an embodiment, the maximum width of each micro LED device 400 must comply with the available space in the bank opening 128 for a particular resolution and PPI of the display panel.

Figure 4E:
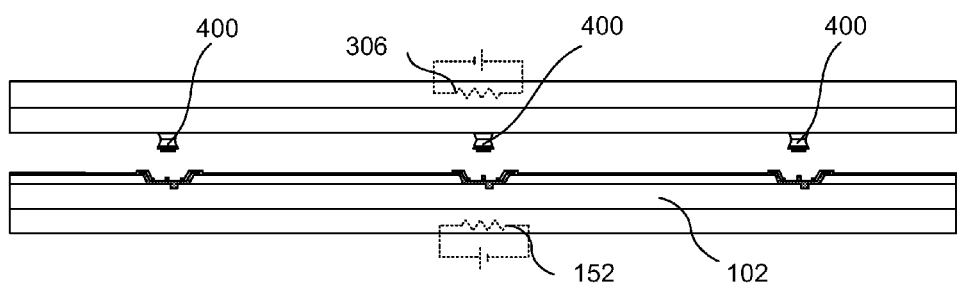

FIG. 4E is a cross-sectional side view illustration of an array of transfer heads holding an array micro LED devices 400 over a TFT substrate 102 accordance with an embodiment of the invention. FIG. 4E is substantially similar to the structure illustrated in FIG. 4D with the primary difference being the illustration of the transfer of an array of micro LED devices as opposed to a single micro LED device within the array of micro LED devices.

Figure 4F:
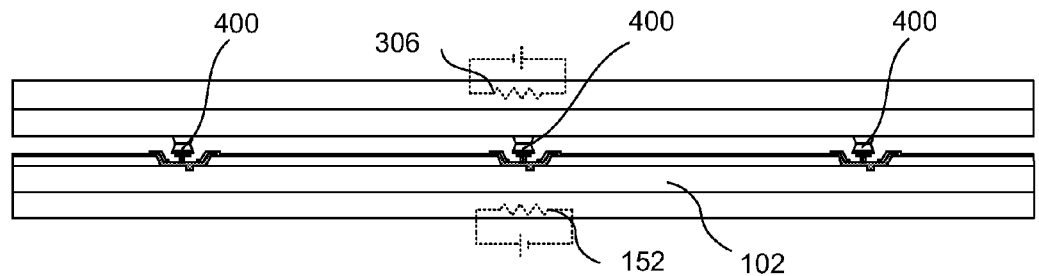

Referring now to FIG. 4F the TFT substrate 102 is contacted with the array of micro LED devices 400. In the embodiment illustrated, contacting the TFT substrate 102 with the array of micro LED devices 400 includes contacting bonding layer 140 with a micro LED device bonding layer 410 for each respective micro LED device. In an embodiment, each micro LED device bonding layer 410 is wider than a corresponding bonding layer 140. In an embodiment energy is transferred from the electrostatic transfer head assembly and through the array of micro LED devices 400 to bond the array of micro LED devices 400 to the TFT substrate 102. For example, thermal energy may be transferred to facilitate several types of bonding mechanisms such as eutectic alloy bonding, transient liquid phase bonding, and solid state diffusion bonding. The transfer of thermal energy may also be accompanied by the application of pressure from the electrostatic transfer head assembly.

Figure 4G:
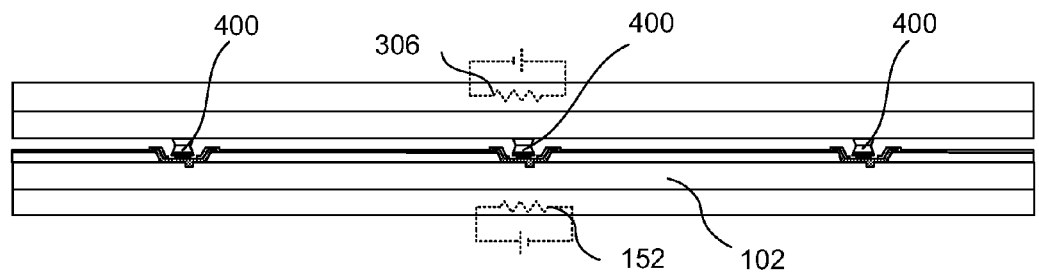

Referring to FIG. 4G, in an embodiment, the transfer of energy liquefies bonding layer 140. The liquefied bonding layer 140 may act as a cushion and partially compensate for system uneven leveling (e.g. nonplanar surfaces) between the array of micro devices 400 and the TFT substrate during bonding, and for variations in height of the micro LED devices. In the particular implementation of transient liquid phase bonding the liquefied bonding layer 140 inter-diffuses with the micro LED device bonding layer 410 to form an inter-metallic compound layer with an ambient melting temperature higher than the ambient melting temperature of the bonding layer 140. Accordingly, transient liquid phase bonding may be accomplished at or above the lowest liquidus temperature of the bonding layers. In some embodiments of the invention, the micro LED device bonding layer 410 is formed of a material having a melting temperature above 250° C. such as bismuth (271.4° C.), or a melting temperature above 350° C. such as gold (1064° C.), copper (1084° C.), silver (962° C.), aluminum (660° C.), zinc (419.5° C.), or nickel (1453° C.), and the TFT substrate bonding layer 140 has a melting temperature below 250° C. such as tin (232° C.) or indium (156.7° C.).

In this manner, the substrate 150 supporting the TFT substrate 102 can be heated to a temperature below the melting temperature of the bonding layer 140, and the substrate 304 supporting the array of transfer heads is heated to a temperature below the melting temperature of bonding layer 410, but above the melting temperature of bonding layer 140. In such an embodiment, the transfer of heat from the electrostatic transfer head assembly through the array of micro LED devices 400 is sufficient to form the transient liquid state of bonding layer 140 with subsequent isothermal solidification as an inter-metallic compound. While in the liquid phase, the lower melting temperature material both spreads out over the surface and diffused into a solid solution of the higher melting temperature material or dissolves the higher melting temperature material and solidifies as an inter-metallic compound. In a specific embodiment, the substrate 304 supporting the array of transfer heads is held at 180° C., bonding layer 410 is formed of gold, and bonding layer 140 is formed of indium.

Figure 4H:
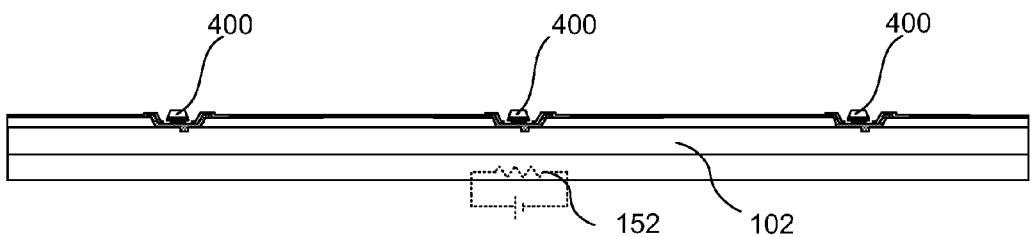

Following the transfer of energy to bond the array of micro LED devices 400 to the TFT substrate, the array of micro LED devices 400 are released onto the receiving substrate and the array of electrostatic transfer heads are moved away as illustrated in FIG. 4H. Releasing the array of micro LED devices 400 may be accomplished with a variety of methods including turning off the electrostatic voltage sources, lowering the voltage across the electrostatic transfer head electrodes, changing a waveform of an AC voltage, and grounding the voltage sources.

Figure 5A:
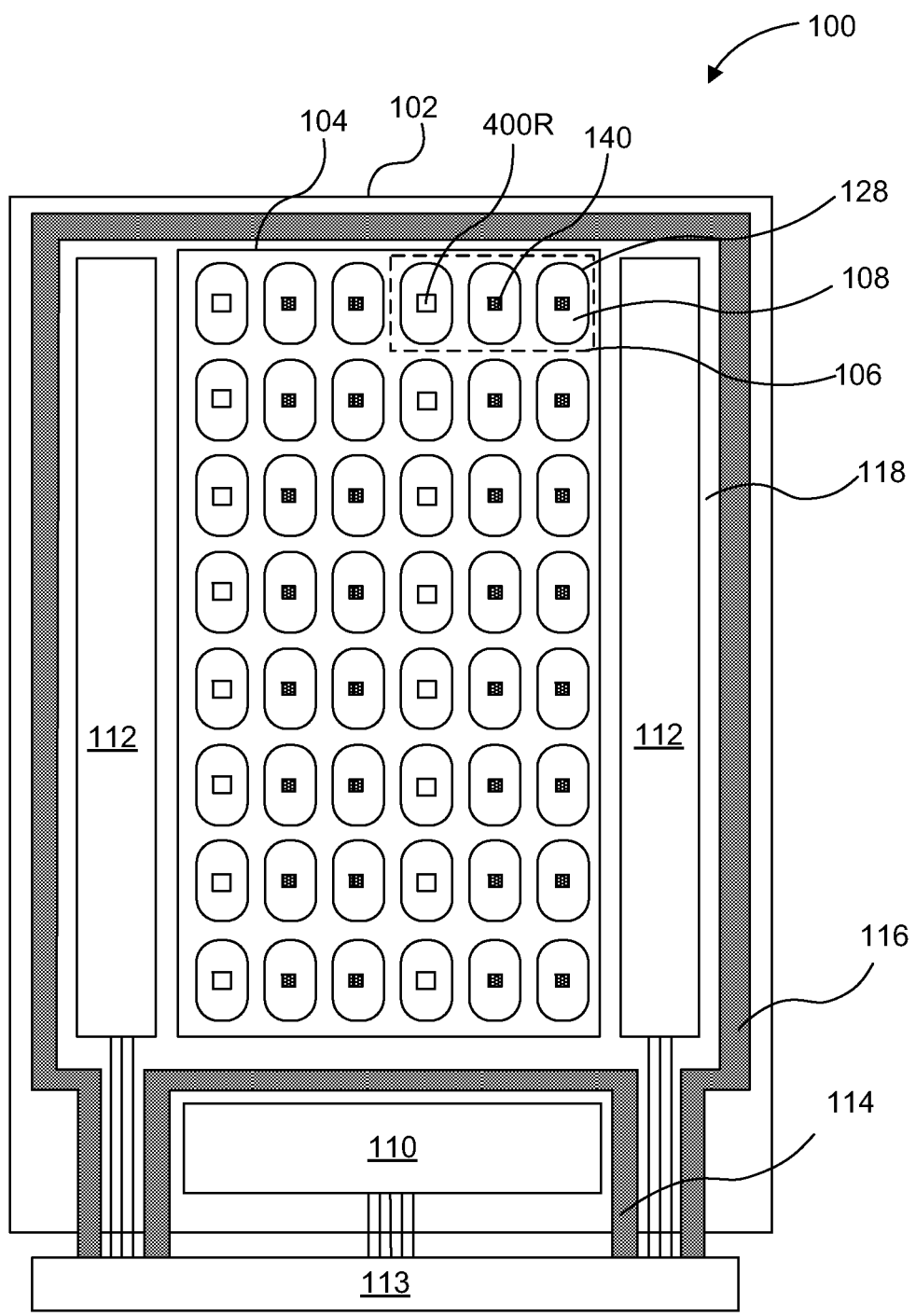
FIGS. 5A-5C are top view illustrations for a sequence of transferring an array of micro LED devices with different color emissions in accordance with an embodiment of the invention.
Figure 5B:
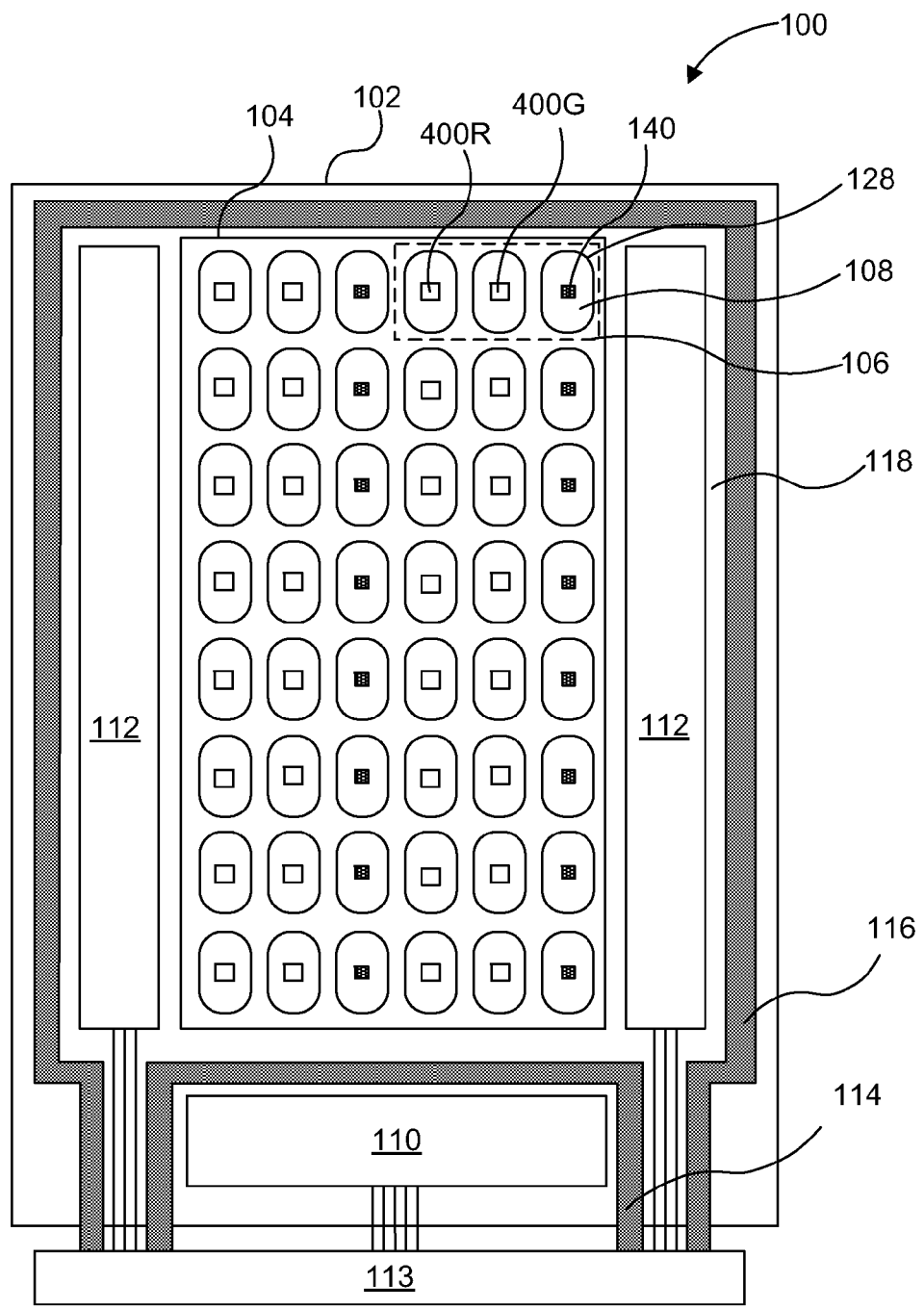
Figure 5C:
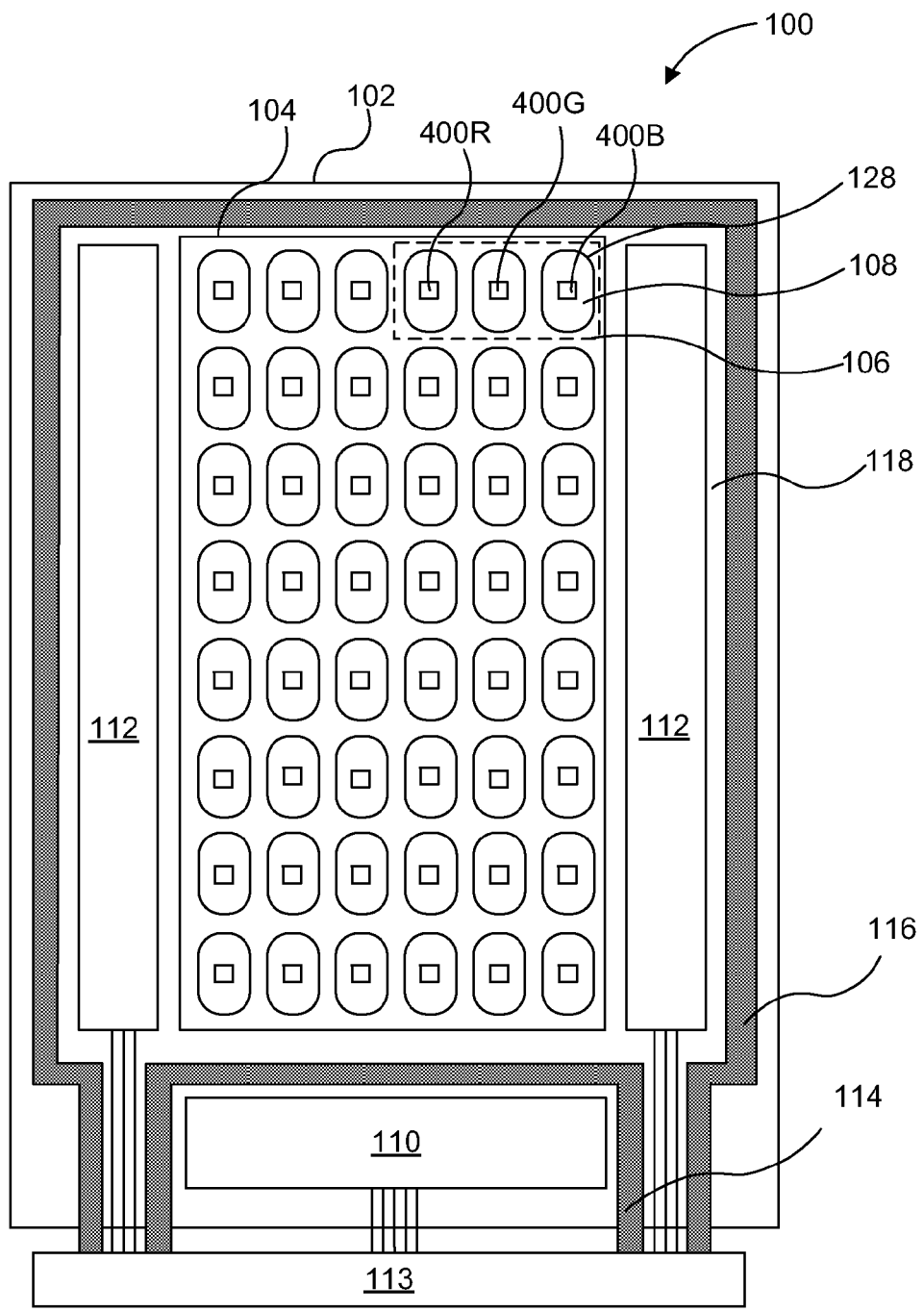

Referring now to FIGS. 5A-5C, a sequence of transferring an array of micro LED devices 400 with different color emissions is illustrated in accordance with an embodiment of the invention. In the particular configuration illustrated in FIG. 5A, a first transfer procedure has been completed for transferring an array of red-emitting micro LED devices 400R from a first carrier substrate to the TFT substrate 102. For example, where the micro LED devices 400R are designed to emit a red light (e.g. 620-750 nm wavelength) the micro p-n diode 450 may include a material such as aluminum gallium arsenide (AlGaAs), gallium arsenide phosphide (GaAsP), aluminum gallium indium phosphide (AlGaInP), and gallium phosphide (GaP). Referring to FIG. 5B, a second transfer procedure has been completed for transferring an array of green-emitting micro LED devices 400G from a second carrier substrate to the TFT substrate 102. For example, where the micro LED devices 400G are designed to emit a green light (e.g. 495-570 nm wavelength) the micro p-n diode 450 may include a material such as indium gallium nitride (InGaN), gallium nitride (GaN), gallium phosphide (GaP), aluminum gallium indium phosphide (AlGaInP), and aluminum gallium phosphide (AlGaP). Referring to FIG. 5C, a third transfer procedure has been completed for transferring an array of blue-emitting micro LED devices 400B from a third carrier substrate to the TFT substrate 102. For example, where the micro LED devices 400B are designed to emit a blue light (e.g. 450-495 nm wavelength) the micro p-n diode 450 may include a material such as gallium nitride (GaN), indium gallium nitride (InGaN), and zinc selenide (ZnSe).

In accordance with embodiments of the invention, the transfer heads are separated by a pitch (x, y, and/or diagonal) that matches a pitch of the bank openings on the backplane corresponding to the pixel or subpixel array. Table 1 provides a list of exemplary implementations in accordance with embodiments of the invention for various red-green-blue (RGB) displays with 1920×1080 p and 2560×1600 resolutions. It is to be appreciated that embodiments of the invention are not limited to RGB color schemes or the 1920×1080 p or 2560×1600 resolutions, and that the specific resolution and RGB color scheme is for illustrational purposes only.

TABLE 1

| Display Substrate | Pixel Pitch (x, y) | Sub-Pixel pitch (x, y) | Pixels per inch (PPI) | Possible transfer head array pitch |
|---|---|---|---|---|
| 55" 1920 × 1080 | (634 µm, 634 µm) | (211 µm, 634 µm) | 40 | X: Multiples or fractions of 211 µm<br>Y: Multiples or fractions of 634 µm |
| 10" 2560 × 1600 | (85 µm, 85 µm) | (28 µm, 85 µm) | 299 | X: Multiples or fractions of 28 µm<br>Y: Multiples or fractions of 85 µm |
| 4" 640 × 1136 | (78 µm, 78 µm) | (26 µm, 78 µm) | 326 | X: Multiples or fractions of 26 µm<br>Y: Multiples or fractions of 78 µm |
| 5" 1920 × 1080 | (58 µm, 58 µm) | (19 µm, 58 µm) | 440 | X: Multiples or fractions of 19 µm<br>Y: Multiples or fractions of 58 µm |

In the above exemplary embodiments, the 40 PPI pixel density may correspond to a 55 inch 1920×1080 p resolution television, and the 326 and 440 PPI pixel density may correspond to a handheld device with RETINA (RTM) display. In accordance with embodiments of the invention, thousands, millions, or even hundreds of millions of transfer heads can be included in a micro pick up array of a mass transfer tool depending upon the size of the micro pick up array. In accordance with embodiments of the invention, a 1 cm×1.12 cm array of transfer heads can include 837 transfer heads with a 211 µm, 634 µm pitch, and 102,000 transfer heads with a 19 µm, 58 µm pitch.

The number of micro LED devices picked up with the array of transfer heads may or may not match the pitch of transfer heads. For example, an array of transfer heads separated by a pitch of 19 µm picks up an array of micro LED devices with a pitch of 19 µm. In another example, an array of transfer heads separated by a pitch of 19 µm picks up an array of micro LED devices with a pitch of approximately 6.33 µm. In this manner the transfer heads pick up every third micro LED device for transfer to the backplane. In accordance with some embodiments, the top surface of the array of light emitting micro devices is higher than the top surface of the insulator layer 146 so as to prevent the transfer heads from being damaged by or damaging the insulator layer (or any intervening layer) on the backplane during placement of the micro LED devices within bank openings.

Figure 6A:
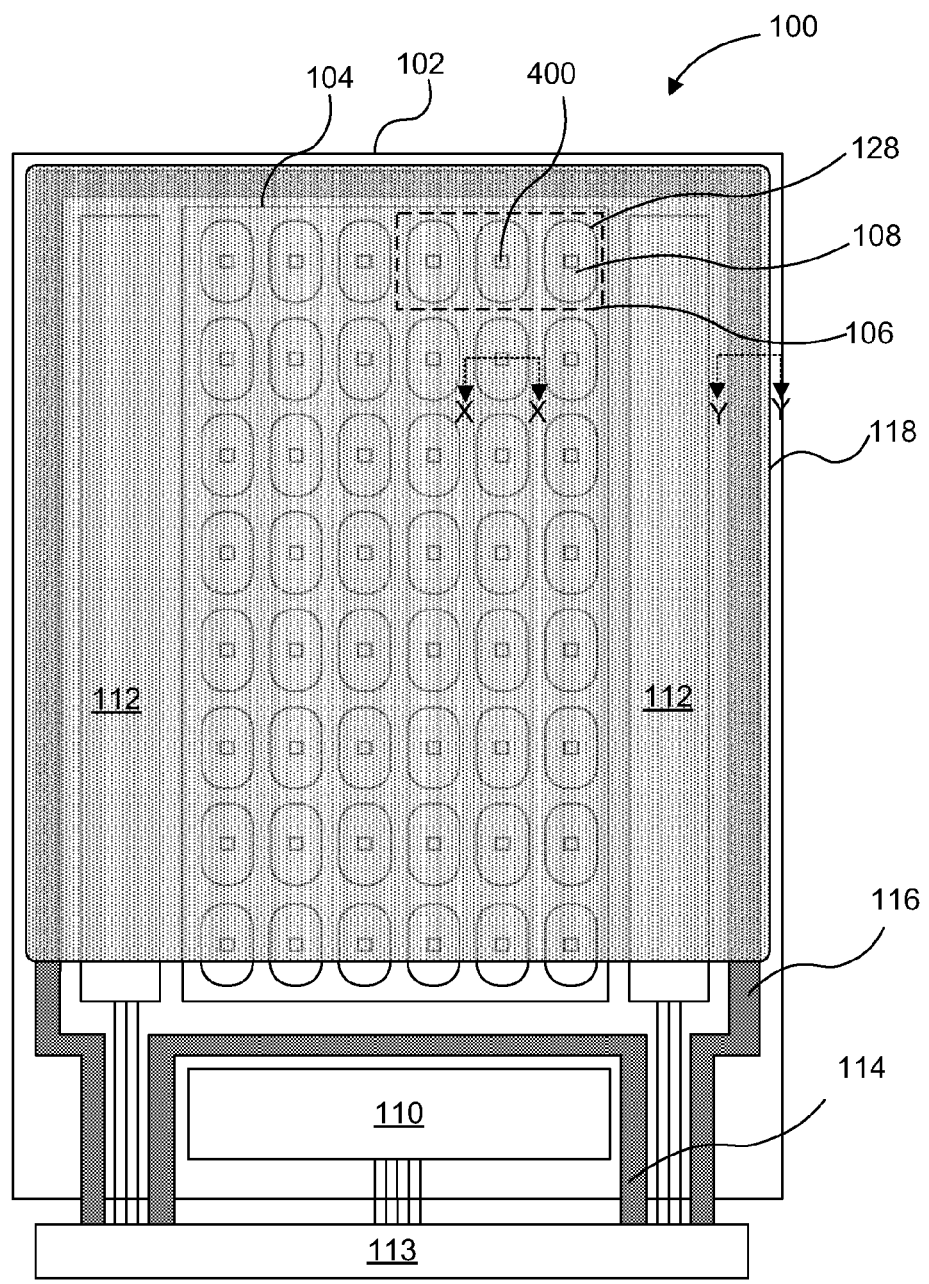
FIG. 6A is a top view illustration of an active matrix display panel after the formation of a top electrode layer in accordance with an embodiment.
Figure 6B:
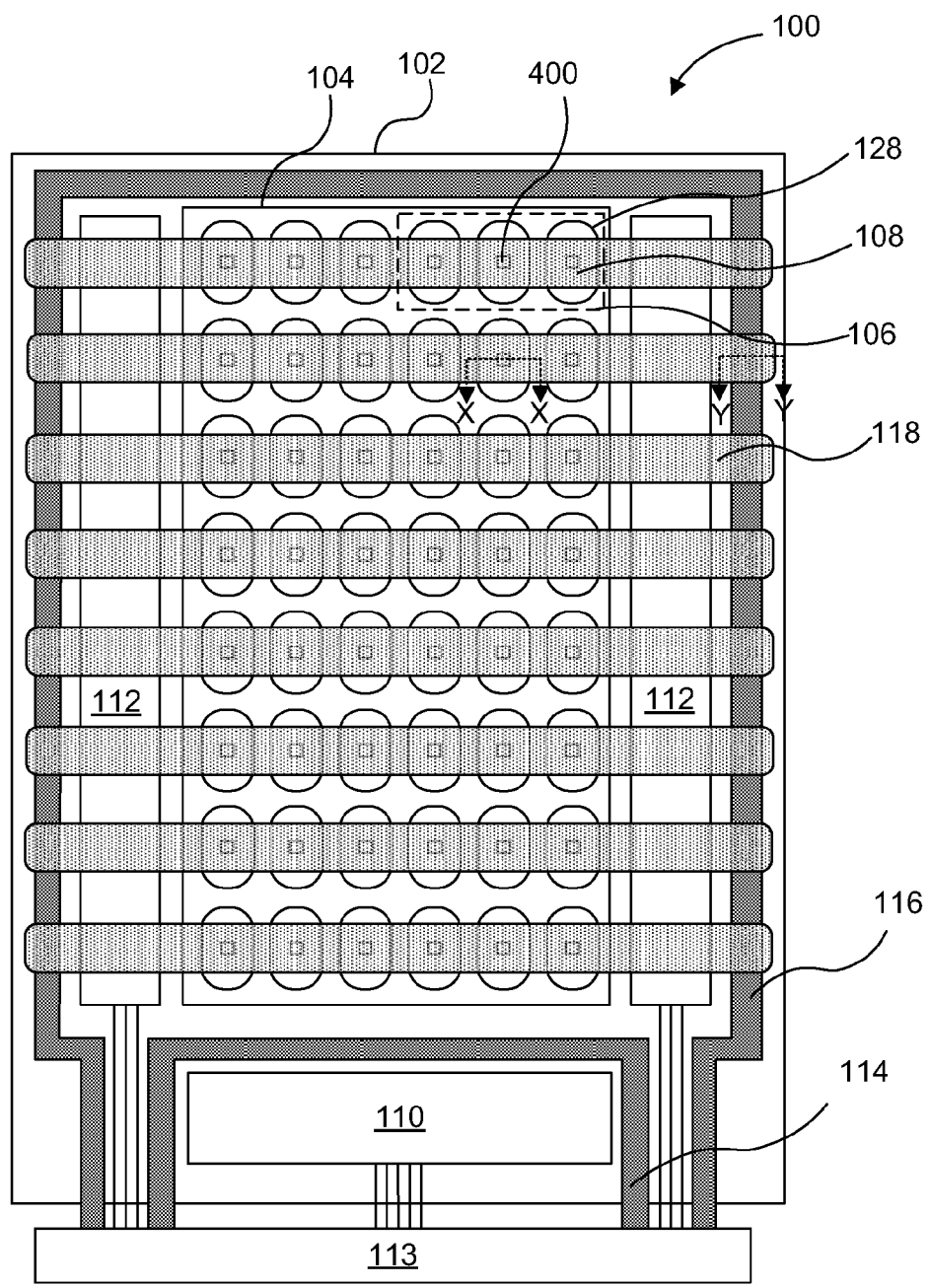
FIG. 6B is a top view illustration of an active matrix display panel after the formation of separate top electrode layers in accordance with an embodiment.
Figure 6D:
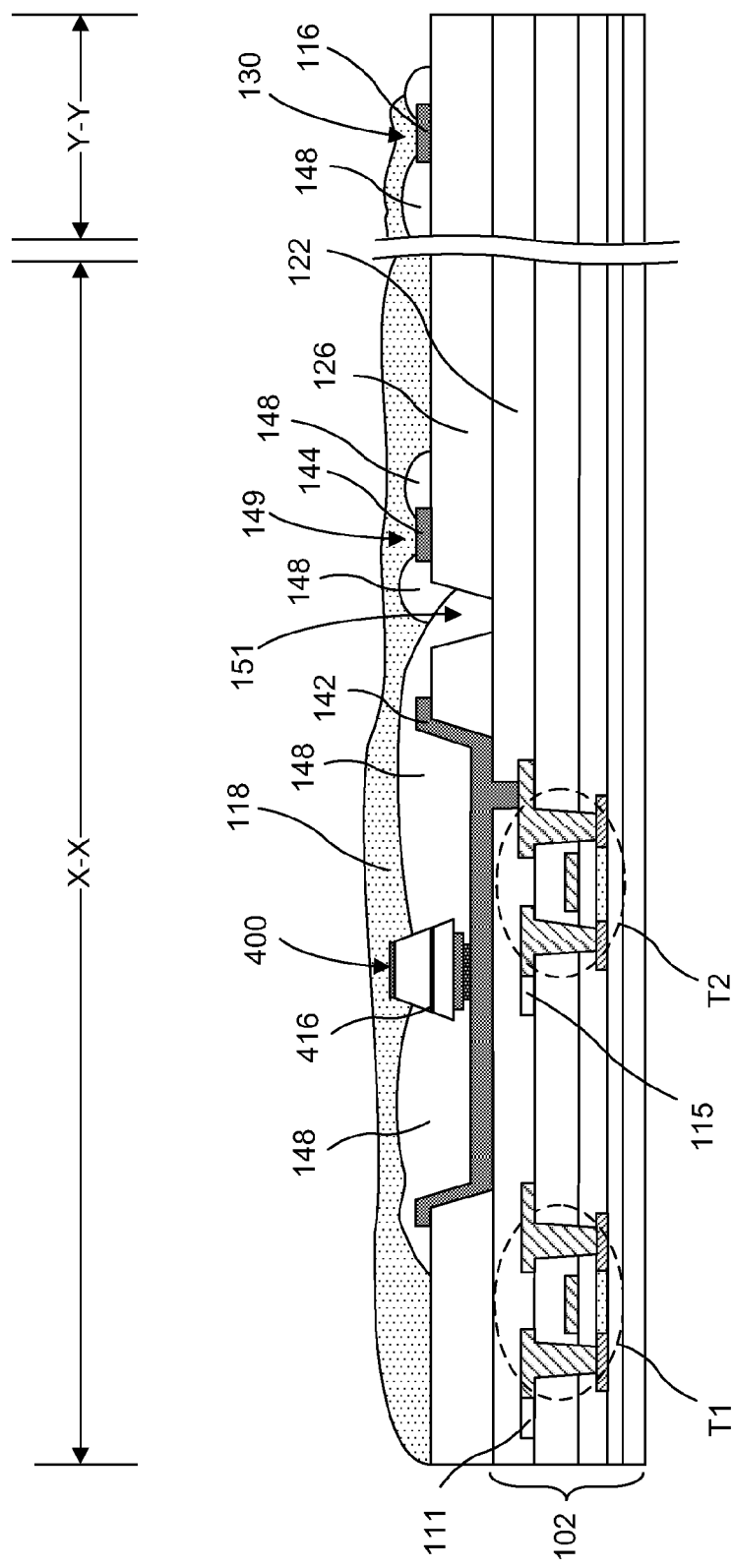
FIG. 6D is a side-view illustration of the active matrix display panel of either FIG. 6A or FIG. 6B taken along lines X-X and Y-Y in accordance with an embodiment of the invention.

FIG. 6A is a top view illustration of an active matrix display panel in accordance with an embodiment after the formation of a top electrode layer. FIG. 6B is a top view illustration of an active matrix display panel in accordance with an embodiment after the formation of separate top electrode layers. FIGS. 6C-6D are side-view illustrations of the active matrix display panel of either FIG. 6A or FIG. 6B taken along lines X-X and Y-Y in accordance with embodiments of the invention. In accordance with the embodiments illustrated in FIGS. 6A-6B, one or more top electrode layers 118 are formed over the pixel area 104 including the array of micro LED devices 400 as well as in the non-pixel area and overlapping the ground ring 116.

Referring now to FIGS. 6C-6D, prior to forming the one or more top electrode layers 118 the micro LED devices 400 are passivated within the bank openings 128 in order to prevent electrical shorting between the top and bottom electrode layers 118, 142, or shorting at the one or more quantum wells 416. As illustrated, after the transfer of the array micro LED devices 400, a passivation layer 148 may be formed around the sidewalls of the micro LED devices 400 within the array of bank openings 128. In an embodiment, where the micro LED devices 400 are vertical LED devices, the passivation layer 148 covers and spans the quantum well structure 416. The passivation layer 148 may also cover any portions of the bottom electrode layer 142 not already covered by the optional insulator layer 146 in order to prevent possible shorting. Accordingly, the passivation layer 148 may be used to passivate the quantum well structure 416, as well as the bottom electrode layer. In accordance with embodiments of the invention, the passivation layer 148 is not formed on the top surface of the micro LED devices 400, such as top conductive contact 452. In one embodiment, a plasma etching process, e.g. $O_2$ or $CF_4$ plasma etch, can be used after forming the passivation layer 148 to etch back the passivation layer 148, ensuring the top surface of the micro LED devices 400, such as top conductive contacts 452, are exposed to enable the top conductive electrode 118 layers 118 to make electrical contact with the micro LED devices 400.

In accordance with embodiments of the invention, the passivation layer 148 may be transparent or semi-transparent to the visible wavelength so as to not significantly degrade light extraction efficiency of the completed system. Passivation layer may be formed of a variety of materials such as, but not limited to, epoxy, acrylic (polyacrylate) such as poly(methyl methacrylate) (PMMA), benzocyclobutene (BCB), polyimide, and polyester. In an embodiment, passivation layer 148 is formed by ink jet printing or screen printing around the micro LED devices 400.

In the particular embodiment illustrated in FIG. 6C, the passivation layer 148 is only formed within the bank openings 128. However, this is not required, and the passivation layer 148 may be formed on top of the bank structure layer 126. Furthermore, the formation of insulator layer 146 is not required, and passivation layer 148 can also be used to electrically insulate the conductive layers. As shown in the embodiment illustrated in FIG. 6D, the passivation layer 148 may also be used to passivate sidewalls of the conductive layer forming the bottom electrode 142. In an embodiment, passivation layer 148 may optionally be used to passivate ground ring 116. In accordance with some embodiments, the formation of openings 130 can be formed during the process of ink jet printing or screen printing the passivation layer 148 over the ground ring 116. In this manner, a separate patterning operation may not be required to form the openings 130.

In accordance with some embodiments of the invention a canal 151, or well structure, can be formed within the bank layer 126 as illustrated in FIG. 6D in order to capture or prevent the passivation layer 148 from spreading excessively and overflowing over the ground tie lines 149, particularly when the passivation layer 148 is formed using a solvent system such as with ink jet printing or screen printing. Accordingly, in some embodiments, a canal 151 is formed within the bank layer 126 between the bank opening 128 and an adjacent ground tie line 144.

Still referring to FIGS. 6C-6D, after formation of passivation layer 148 one or more top conductive electrode layers 118 are formed over each micro LED device 400 and in electrical contact with the top contact layer 452, if present. Depending upon the particular application in the following description, top electrode layers 118 may be opaque, reflective, transparent, or semi-transparent to the visible wavelength. For example, in top emission systems the top electrode layer 118 may be transparent, and for bottom emission systems the top electrode layer may be reflective. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment, the top electrode layer 118 includes nanoparticles such as silver, gold, aluminum, molybdenum, titanium, tungsten, ITO, and IZO. In a particular embodiment, the top electrode layer 118 is formed by ink jet printing or screen printing ITO or a transparent conductive polymer such as PEDOT. Other methods of formation may include chemical vapor deposition (CVD), physical vapor deposition (PVD), spin coating. The top electrode layer 118 may also be reflective to the visible wavelength. In an embodiment, a top conductive electrode layer 118 comprises a reflective metallic film such as aluminum, molybdenum, titanium, titanium-tungsten, silver, or gold, or alloys thereof, for example for use in a bottom emission system.

Referring back to FIG. 6A again, in the particular embodiment illustrated a top electrode layer 118 is formed over the pixel area 104 including the array of micro LED devices 400 as well as in the non-pixel area and overlapping the ground ring 116. The top electrode layer 118 may also be formed within the openings 130, if present, and over the ground ring 116.

FIG. 6B illustrates an alternative embodiment in which separate top electrode layers 118 are formed connecting one or more rows of micro LED devices 400 with the ground ring. In the particular embodiment illustrated, the top electrode layers 118 provide the electrical path from a micro LED device 400 to the ground ring. It is not required for the top electrode layers 118 to cover the entire pixel area 104, or the entire bank opening 128. In the particular embodiment illustrated, each top electrode layer 118 is connected to opposite sides of the ground ring 116 and runs horizontally across the TFT substrate connecting a single row of micro LEDs 400. However, this particular configuration is exemplary and a number of different arrangements are possible. For example, a single top electrode layer 118 may run over, and electrically connect an n-number of rows of micro LEDs to the ground ring. In another embodiment, the top electrode layers 118 are only connected to one side of the ground ring 116, or ground line. As illustrated in FIGS. 6A-6B, ink jet line width for the top electrode layers 118 can vary depending upon application. For example, the line width may approach that of the pixel area 104. Alternatively, the line width may be minimal. For example, line widths as low as approximately 15 μm may be accomplished with commercially available ink jet printers. Accordingly, the line width of the top electrode layers 118 may be more or less than the maximum width of the micro LED devices.

In one aspect, the particular embodiment illustrated in FIG. 6B may be particularly suitable for localized formation of the top electrode layers 118 with ink jet printing or screen printing. Conventional AMOLED backplane processing sequences such as those used for the fabrication of the display panels in FIGS. 1-2 typically blanket deposit the top electrode layer in deposition a chamber, followed by singulation of the individual backplanes from a larger substrate. In accordance with some embodiments, the display panel\backplane 100 is singulated from a larger substrate prior to transferring the array of micro LED devices 400. In an embodiment, ink jet printing or screen printing provides a practical approach for patterning the individual top electrode layers 118 without requiring a separate mask layer for each separate display panel backplane 100.

While not illustrated separately it is to be appreciated that the embodiments illustrated in FIGS. 6A-6D are combinable with the alternative opening configurations included in FIGS. 3C-3D.

Figure 7:
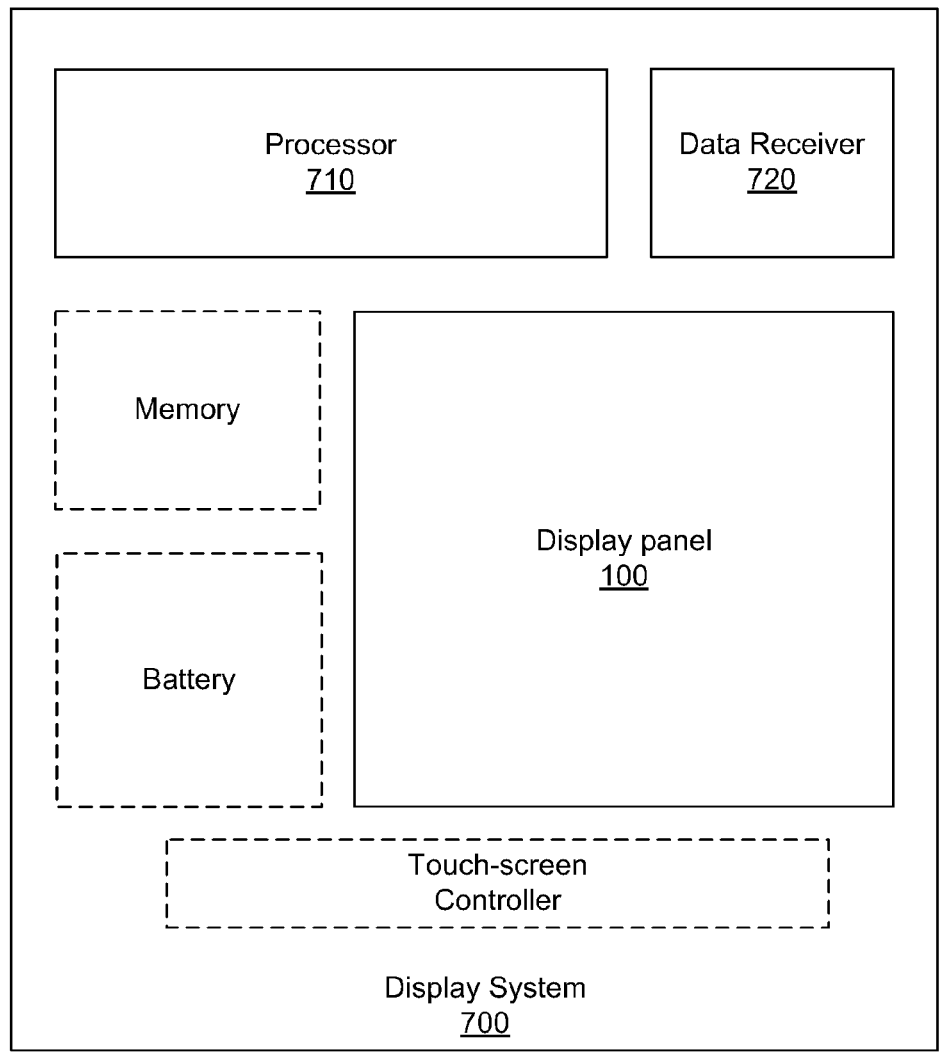
FIG. 7 is a schematic illustration of a display system in accordance with an embodiment of the invention.

FIG. 7 illustrates a display system 700 in accordance with an embodiment. The display system houses a processor 710, data receiver 720, a display panel 100, such as any of the display panels described above. The data receiver 720 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Depending on its applications, the display system 700 may include other components. These other components include, but are not limited to, memory, a touch-screen controller, and a battery. In various implementations, the display system 700 may be a television, tablet, phone, laptop, computer monitor, kiosk, digital camera, handheld game console, media display, ebook display, or large area signage display.

In utilizing the various aspects of this invention, it would become apparent to one skilled in the art that combinations or variations of the above embodiments are possible for integrating micro LED devices into an active matrix display panel. While the above embodiments have been described with regard to a top emission structure, embodiments of the invention are also applicable to bottom emission structures. For example, rather than locating the bank openings 128 or sub-pixel openings 127 above the TFT circuitry, the openings could be located adjacent the TFT circuitry on lower layers in the TFT substrate 102. Similarly, while top gate transistor structures have been described, embodiments of the invention may also be practiced with bottom gate transistor structures. Furthermore, while embodiments of the invention have been described and illustrated with regard to a high side drive configuration, embodiments may also be practiced with a low side drive configuration in which the ground ring described above becomes the power line in the panel. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A display panel comprising:
   a lower conductive layer including a ground line;
   a planarization layer over the lower conductive layer;
   an opening in the planarization layer;
   a patterned top conductive layer over the planarization layer, wherein the patterned top conductive layer includes:
     an array of bottom electrodes; and
     a ground contact within the opening in the planarization layer and in electrical contact with the ground line;
   a corresponding plurality of light emitting diodes (LEDs) bonded to the array of bottom electrodes; and
   one or more top electrode layers on and in electrical contact with the plurality of LEDs and the ground contact.

2. The display panel of claim 1, wherein each LED comprises an inorganic semiconductor-based p-n diode.

3. The display panel of claim 2, wherein each LED is a vertical LED with a maximum width of 1 μm-100 μm.

4. The display panel of claim 3, wherein each bottom electrode is independently addressable.

5. The display panel of claim 4, wherein each LED device has a maximum width of 1 μm-20 μm.

6. The display panel of claim 3, wherein the one or more top electrode layers includes a single top electrode layer on and in electrical contact with the plurality of LEDs and the ground contact.

7. The display panel of claim 3, wherein the one or more top electrode layers includes a plurality of top electrode layers.

8. The display panel of claim 7, wherein each top electrode layer spans over a plurality of rows of LEDs.

9. The display panel of claim 7, wherein each top electrode layer spans over a single row of LEDs.

10. The display panel of claim 3, further comprising a patterned bank layer including an array of bank openings over the planarization layer, wherein each LED is within a corresponding bank opening.

11. The display panel of claim 10, further comprising a passivation layer spanning sidewalls of the array of LEDs within the array of bank openings, wherein the passivation layer does not completely cover a top conductive contact of each LED.

12. The display panel of claim 11, wherein the one or more top electrode layers spans across the passivation layer.

13. The display panel of claim 11, wherein the passivation layer is transparent to the visible wavelength spectrum.

14. The display panel of claim 11, wherein the patterned bank layer is opaque.

15. The display panel of claim 11, wherein the passivation layer spans a quantum well structure for each LED.

16. The display panel of claim 11, wherein the opening is formed in the patterned bank layer and the planarization layer, and the ground contact is within the opening in both the patterned bank layer and the planarization layer, and is in electrical contact with the ground line.

17. The display panel of claim 3, wherein each LED is bonded to a corresponding bottom electrode with an In—Au compound.

18. The display panel of claim 3, wherein the one or more top electrode layers comprises a transparent conductive oxide.

19. The display panel of claim 18, wherein the transparent conductive oxide is indium-tin oxide.

20. The display panel of claim 3, wherein the one or more top electrode layers comprises a transparent conductive polymer.

* * * * *